US010208196B2

(12) United States Patent
Nilsson et al.

(10) Patent No.: US 10,208,196 B2
(45) Date of Patent: Feb. 19, 2019

(54) POLYMER COMPOSITION FOR W AND C APPLICATION WITH ADVANTAGEOUS ELECTRICAL PROPERTIES

(75) Inventors: Ulf Nilsson, Stenungsund (SE); Per-Ola Hagstrand, Stenungsund (SE); Villgot Englund, Göteborg (SE); Andreas Farkas, Stenungsund (SE); Janis Ritums, Lidingö (SE)

(73) Assignee: BOREALIS AG, Vienna (AT)

( * ) Notice: Subject to any disclaimer, the term of this patent is extended or adjusted under 35 U.S.C. 154(b) by 583 days.

(21) Appl. No.: 13/635,524

(22) PCT Filed: Mar. 1, 2011

(86) PCT No.: PCT/EP2011/052990
§ 371 (c)(1),
(2), (4) Date: Dec. 21, 2012

(87) PCT Pub. No.: WO2011/113686
PCT Pub. Date: Sep. 22, 2011

(65) Prior Publication Data
US 2013/0087362 A1 Apr. 11, 2013

(30) Foreign Application Priority Data
Mar. 17, 2010 (EP) ..................... 10156721

(51) Int. Cl.
*C08L 23/26* (2006.01)
*C08L 23/06* (2006.01)
*H01B 3/44* (2006.01)
*H01B 9/02* (2006.01)
*H01L 21/31* (2006.01)

(52) U.S. Cl.
CPC ............... *C08L 23/26* (2013.01); *C08L 23/06* (2013.01); *H01B 3/441* (2013.01); *H01B 9/027* (2013.01); *H01L 21/31* (2013.01); *C08L 2203/202* (2013.01); *C08L 2205/02* (2013.01); *C08L 2205/025* (2013.01); *C08L 2312/00* (2013.01)

(58) Field of Classification Search
CPC ........ H01R 13/512; H01R 13/59; H01R 9/03; H01R 9/0518; H01R 9/0521; H01R 9/0524; H01R 9/0527; H01R 4/021; H01R 9/05; H01R 9/0506; H02G 15/076; H02G 15/117; H02G 15/115; H02G 15/02; H02G 15/24; H02G 7/06; H02G 7/12; H02G 3/04; G02B 6/02; G02B 6/44; H01B 11/00; H01B 12/00; H01B 5/00; H01B 7/00; H01B 9/00; H01B 7/1845; H01B 7/10; H01B 1/124; H01B 1/16; H01B 1/18; H01B 7/0045; H01B 1/20; H01B 5/16; H01B 3/441; H01B 9/027; B60R 16/0215; B60R 16/0207; C08L 23/26; C08L 23/06; C08L 2203/202; C08L 2312/00; C08L 2205/02; C08L 2205/025; H01L 21/31
See application file for complete search history.

(56) References Cited

U.S. PATENT DOCUMENTS

| | | | |
|---|---|---|---|
| 2,528,523 A | 11/1950 | Kent | |
| 2,601,224 A | 6/1952 | Roedel | |
| 3,079,370 A | 2/1963 | Gilbert | |
| 3,242,150 A | 3/1966 | Scoggin | |
| 3,280,220 A | 10/1966 | Nelson | |
| 3,324,093 A | 6/1967 | Alleman | |
| 3,374,211 A | 3/1968 | Marwil et al. | |
| 3,401,020 A | 9/1968 | Kester et al. | |
| 3,405,109 A | 10/1968 | Rohlfing | |
| 3,738,866 A | 6/1973 | Martens | |
| 3,922,335 A | 11/1975 | Jordan et al. | |
| 4,297,310 A | 10/1981 | Akutsu et al. | |
| 4,305,489 A | 12/1981 | Hoppie | |
| 4,340,577 A | 7/1982 | Sugawara et al. | |
| 4,351,876 A | 9/1982 | Doi et al. | |
| 4,391,789 A | 7/1983 | Estopinal | |
| 4,397,981 A | 8/1983 | Doi et al. | |
| 4,413,066 A | 11/1983 | Isaka et al. | |
| 4,446,283 A | 5/1984 | Doi et al. | |
| 4,456,704 A | 6/1984 | Fukumura et al. | |
| 4,532,311 A | 7/1985 | Fulks et al. | |
| 4,543,399 A | 9/1985 | Jenkins et al. | |
| 4,555,539 A | 11/1985 | Bonicel et al. | |
| 4,578,879 A | 4/1986 | Yokoyama et al. | |
| 4,582,816 A | 4/1986 | Miro | |
| 4,621,952 A | 11/1986 | Aronson | |
| 4,732,939 A | 3/1988 | Hoshi et al. | |
| 4,803,251 A | 2/1989 | Goode et al. | |
| 4,812,505 A | 3/1989 | Topcik | |

(Continued)

FOREIGN PATENT DOCUMENTS

EP 0318841 6/1989
EP 0688794 12/1995
(Continued)

OTHER PUBLICATIONS

Wikipedia Definition of "Polyolefin".*
Encyclopedia of Polymer Science and Engineering, vol. 6, 1986, pp. 383-410.
Klimesch, R., et al., "Polyethylene: High-pressure," Encyclopedia of Materials: Science and Technology, Elsevier Science Ltd., 2001, pp. 7181-7184.
Olsson, C.O., et al., "Experimental determination of DC conductivity for XLPE Insulation," Proceedings of the 21$^{st}$ Nordic Insulation Symposium (Nord-IS '09), Gothenburg, Sweden, Jun. 15-17, 2009, pp. 55-58.

(Continued)

*Primary Examiner* — Pete T Lee
(74) *Attorney, Agent, or Firm* — Meunier Carlin & Curfman LLC

(57) ABSTRACT

The invention relates to a polymer composition with improved DC electrical properties, to the use of the composition for producing a cable layer and to a cable surrounded by at least one layer comprising the polymer composition.

11 Claims, No Drawings

(56) References Cited

U.S. PATENT DOCUMENTS

| | | | |
|---|---|---|---|
| 4,855,370 A | 8/1989 | Chirillo et al. | |
| 4,933,149 A | 6/1990 | Rhee et al. | |
| 4,997,713 A | 3/1991 | Koehnlein et al. | |
| 5,026,795 A | 6/1991 | Hogan | |
| 5,153,272 A | 10/1992 | Chiodini et al. | |
| 5,276,202 A | 1/1994 | Ceh et al. | |
| 5,391,654 A | 2/1995 | Ahvenainen et al. | |
| 5,532,066 A | 7/1996 | Latiolais et al. | |
| 5,539,075 A | 7/1996 | Gustafsson et al. | |
| 5,731,082 A | 3/1998 | Gross et al. | |
| 5,798,427 A | 8/1998 | Foster et al. | |
| 6,063,845 A | 5/2000 | Nylander | |
| 6,197,852 B1 | 3/2001 | Lee | |
| 6,225,510 B1 | 5/2001 | Frenkel et al. | |
| 6,270,856 B1 | 8/2001 | Hendewerk et al. | |
| 6,369,129 B1* | 4/2002 | Mårtensson | C08L 23/04 523/173 |
| 6,441,309 B1 | 8/2002 | Jow et al. | |
| 6,797,886 B1 | 9/2004 | Gustafsson et al. | |
| 6,924,031 B2 | 8/2005 | Redondo et al. | |
| 7,196,267 B2* | 3/2007 | Sekiguchi | C08L 23/0815 174/120 SC |
| 8,592,524 B2* | 11/2013 | Ouhadi | C08L 23/0815 264/328.1 |
| 8,729,393 B2 | 5/2014 | Cho et al. | |
| 2001/0030053 A1 | 10/2001 | Gadessaud et al. | |
| 2003/0113496 A1 | 6/2003 | Harris et al. | |
| 2004/0039115 A1* | 2/2004 | Ishida | C08L 23/06 525/53 |
| 2004/0091631 A1* | 5/2004 | Belli et al. | 427/430.1 |
| 2004/0197057 A1 | 10/2004 | Lee et al. | |
| 2006/0090672 A1 | 5/2006 | Lu et al. | |
| 2006/0124341 A1* | 6/2006 | Perego et al. | 174/110 R |
| 2006/0211807 A1 | 9/2006 | Koning et al. | |
| 2007/0049682 A1 | 3/2007 | Walsh | |
| 2007/0049711 A1 | 3/2007 | Kuo et al. | |
| 2007/0066758 A1 | 3/2007 | McArdle et al. | |
| 2008/0073105 A1 | 3/2008 | Clark et al. | |
| 2008/0118726 A1 | 5/2008 | Pfeiffer | |
| 2008/0196922 A1 | 8/2008 | Van Marion et al. | |
| 2008/0240662 A1 | 10/2008 | Helvenstein | |
| 2009/0029166 A1 | 1/2009 | Bostrom et al. | |
| 2009/0200059 A1 | 8/2009 | Cinquemani et al. | |
| 2009/0227717 A1 | 9/2009 | Smedberg et al. | |
| 2010/0036031 A1 | 2/2010 | Herbst et al. | |
| 2010/0089611 A1* | 4/2010 | Hampton | H01B 3/441 174/120 SC |
| 2010/0163269 A1 | 7/2010 | Perego et al. | |
| 2011/0003524 A1* | 1/2011 | Claasen | C08F 10/00 442/329 |
| 2012/0145433 A1 | 6/2012 | Suzuki et al. | |
| 2013/0081854 A1 | 4/2013 | Englund et al. | |
| 2013/0338316 A1* | 12/2013 | Silvis | C08F 287/00 525/320 |
| 2014/0076741 A1 | 3/2014 | Adams | |
| 2014/0093732 A1 | 4/2014 | Andersson et al. | |

FOREIGN PATENT DOCUMENTS

| | | |
|---|---|---|
| EP | 0810235 | 3/1997 |
| EP | 0947550 | 6/1999 |
| EP | 1283527 | 2/2003 |
| EP | 1484345 | 8/2004 |
| EP | 1695992 | 8/2006 |
| EP | 1849816 | 10/2007 |
| EP | 2010055849 | 3/2010 |
| GB | 1377737 | 12/1974 |
| JP | 2018811 | 1/1990 |
| JP | 03-076288 | 4/1991 |
| JP | H05298927 | 11/1993 |
| JP | 07-133139 | 5/1995 |
| WO | 1985/005216 | 11/1985 |
| WO | 1992/012182 | 7/1992 |
| WO | 1992/021721 | 12/1992 |
| WO | 1993/008222 | 4/1993 |
| WO | 1997038424 | 10/1997 |
| WO | 1998/015591 | 4/1998 |
| WO | 1999044206 | 9/1999 |
| WO | 2001/037289 | 5/2001 |
| WO | 2003/000754 | 1/2003 |
| WO | 2005/087848 | 9/2005 |
| WO | 2006/007927 | 1/2006 |
| WO | 2006/131266 | 12/2006 |
| WO | 2009/007116 | 1/2009 |
| WO | 2009097560 | 8/2009 |
| WO | 2011/113685 | 9/2011 |

OTHER PUBLICATIONS

Parker, J.A., et al., "On high pressure crystallization and the characterization of linear low-density polyethylenes," Polymer, vol. 35, Issue 19, 1994, pp. 4140-4145.

Randall, J.C., "A Review of High Resolution Liquid $^{13}$Carbon Nuclear Magnetic Resonance Characterizations of Ethylene-Based Polymers," Journal of Macromolecular Science, Part C: Polymer Reviews, vol. 29, Issues 2-3, 1989, pp. 201-317.

Office Action, dated Oct. 8, 2014, received in connection with RU Application No. 2012142301/04. (English Translation).

Co-pending RU Application No. 2012142300/04, filed Mar. 1, 2011.

Borealis AG, "Wire & Cable Supercure TM High Productivity XLPE," XP55009940, Retrieved on Oct. 19, 2011 URL:http://www.borealisgroup.com/pdf/literature/borealis-borouge/brochure/K_IN0091_GB_WC_2008_03_BB.pfd. 2010, 16 pgs.

International Search Report, dated Aug. 17, 2011, in related International Application No. PCT/EP2011/052988.

International Preliminary Report on Patentability and Written Opinion, dated Sep. 18, 2012, in related International Application No. PCT/EP2011/052988.

International Search Report and Written Opinion, dated Aug. 26, 2011, in related International Application No. PCT/EP2011/052990.

International Preliminary Report on Patentability, dated Sep. 18, 2012, in related International Application No. PCT/EP2011/052990.

Related U.S. Appl. No. 13/635,517, filed Dec. 18, 2012.

Non-final Office Action, dated Aug. 14, 2015, received in connection with related U.S. Appl. No. 13/635,517.

Restriction Requirement, dated Jan. 2, 2015, received in connection with related U.S. Appl. No. 13/635,517.

Final Office Action dated May 19, 2016 received in connection with related U.S. Appl. No. 13/635,517.

Non-Final Office Action dated Apr. 3, 2017 in U.S. Appl. No. 13/635,517.

Final Office Action dated Oct. 5, 2017, in U.S. Appl. No. 13/635,517.

Non-Final Office Action dated Jun. 14, 2018 in related U.S. Appl. No. 13/635,517.

Maraschin, "Ethylene Polymers, LDPE," Encyclopedia of Polymer Science and Technology, 2002, John Wiley & Sons, Abstract.

\* cited by examiner

POLYMER COMPOSITION FOR W AND C APPLICATION WITH ADVANTAGEOUS ELECTRICAL PROPERTIES

FIELD OF INVENTION

The invention relates to a use of a polymer composition for producing a layer of a power cable, preferably of a direct current (DC) power cable, which is preferably crosslinkable and subsequently crosslinked, to a direct current (DC) power cable, which is preferably crosslinkable and subsequently crosslinked, to a preparation process of the cable, as well as a subgroup of the polyolefin composition.

BACKGROUND ART

Polyolefins produced in a high pressure (HP) process are widely used in demanding polymer applications wherein the polymers must meet high mechanical and/or electrical requirements. For instance in power cable applications, particularly in medium voltage (MV) and especially in high voltage (HV) and extra high voltage (EHV) cable applications the electrical properties of the polymer composition has a significant importance. Furthermore, the electrical properties of importance may differ in different cable applications, as is the case between alternating current (AC) and direct current (DC) cable applications.

A typical power cable comprises a conductor surrounded, at least, by an inner semiconductive layer, an insulation layer and an outer semiconductive layer, in that order. The cables are commonly produced by extruding the layers on a conductor.

Crosslinking of Cables

The polymer material in one or more of said layers is often crosslinked to improve e.g. heat and deformation resistance, creep properties, mechanical strength, chemical resistance and abrasion resistance of the polymer in the layer(s) of the cable. In crosslinking reaction of a polymer interpolymer crosslinks (bridges) are primarily formed. Crosslinking can be effected using e.g. a free radical generating compound. Free radical generating agent is typically incorporated to the layer material prior to the extrusion of the layer(s) on a conductor. After formation of the layered cable, the cable is then subjected to a crosslinking step to initiate the radical formation and thereby crosslinking reaction. Peroxides are very commonly used as free radical generating compounds. The resulting decomposition products of peroxides may include volatile by-products which are often undesired, since e.g. may have a negative influence on the electrical properties of the cable. Therefore the volatile decomposition products such as methane are conventionally reduced to a minimum or removed after crosslinking and cooling step. Such removal step, generally known as a degassing step, is time and energy consuming causing extra costs.

Electrical Conductivity

The DC electrical conductivity is an important material property e.g. for insulating materials for high voltage direct current (HV DC) cables. First of all, the strong temperature and electric field dependence of this property will influence the electric field. The second issue is the fact that heat will be generated inside the insulation by the electric leakage current flowing between the inner and outer semiconductive layers. This leakage current depends on the electric field and the electrical conductivity of the insulation. High conductivity of the insulating material can even lead to thermal runaway under high stress/high temperature conditions. The conductivity must therefore be sufficiently low to avoid thermal runaway.

Accordingly, in HV DC cables, the insulation is heated by the leakage current. For a specific cable design the heating is proportional to the insulation conductivity×(electrical field)$^2$. Thus, if the voltage is increased, far more heat will be generated.

JP2018811A discloses an insulation layer for a DC cable which contains a blend of 2-20 wt % of a high density polyethylene with a low density polyethylene. It is stated that blend provides improved DC breakdown and an impulse property. The blend is mixed with 2-3 wt % of a crosslinking agent. The type and layer structure of the cable has not been specified.

There are high demands to increase the voltage of a power cable, preferably of direct current DC power cable, and thus a continuous need to find alternative polymer compositions with reduced conductivity. Such polymer compositions should preferably also have good mechanical properties required for demanding power cable embodiments.

OBJECTS OF THE INVENTION

One of the objects of the present invention is to provide a use of a further polymer composition with advantageous electrical properties, i.a. low electrical conductivity, for producing power cable layer, preferably a direct current (DC) cable layer. Also an independent subgroup of the polymer composition with advantageous electrical properties is provided.

Another object of the invention is to provide a power cable, preferably a direct current (DC) power cable, wherein at least one layer comprises said polymer composition with advantageous electrical properties, i.a. low electrical conductivity. Also a preparation process of the power cable is provided.

The invention and further objects and benefits thereof are described and defined in details below.

DESCRIPTION OF THE INVENTION

The present invention provides a polymer composition which is highly suitable polymer material for a layer, preferably an insulation layer, of a power cable and which comprises (a) a polyolefin which is other than low density polyethylene (LDPE) and (b) a second polyolefin which is different from the polyolefin (a).

Unexpectedly, when a polyolefin (a) other than LDPE is blended to a second polyolefin (b) the resulting polymer composition exhibits improved electrical properties compared to the electrical properties of the second polyolefin (b) alone. Namely, the polymer composition of the invention has reduced, i.e. low, electrical conductivity. "Reduced" or "low" electrical conductivity as used herein interchangeably means that the value obtained from the DC conductivity measurements (1) and (2) as defined below under "Determination methods" is low, i.e. reduced. The low electrical conductivity is beneficial for minimising the undesired heat formation, e.g. in an insulation layer of a power cable, preferably a DC power cable.

The low electrical conductivity makes the polymer composition very desirable for power cable applications. A power cable is defined to be a cable transferring energy operating at any voltage level, typically operating at voltage higher than 1 kV. The voltage applied to the power cable can be alternating (AC), direct (DC) or transient (impulse). Moreover, the polymer composition is very advantageous layer material for an AC or DC power cable, which can be e.g. a low voltage (LV), a medium voltage (MV), a high voltage (HV) or an extra high voltage (EHV) AC or DC cable, which terms, as well known, indicate the level of operating voltage. The polymer composition is even more preferable layer material for a HV power cable operating at any voltages, preferably for a HV AC or DC power cable operating at voltages higher than 36 kV. For HV AC cables the operating voltage is defined herein as the electric voltage (RMS) between two conductors in the AC three-phase cable system. For HV DC cables the operating voltage is defined herein as the electric voltage between ground and the conductor of the high voltage cable. The preferred cable is a HV DC power cable.

Accordingly, the present invention is further directed to a use of a polymer composition for producing at least one layer, preferably an insulation layer, of a power cable, preferably of a direct current (DC) power cable, comprising a conductor surrounded by at least an inner semiconductive layer, an insulation layer and an outer semiconductive layer, in that order, wherein the polymer composition comprises
(a) a polyolefin which is other than low density polyethylene (LDPE) and
(b) a second polyolefin which is different from the polyolefin (a).

The invention also provides a power cable, preferably a direct current (DC) power cable, comprising a conductor which is surrounded at least by an inner semiconductive layer, an insulation layer and an outer semiconductive layer, in that order, wherein at least one layer, preferably at least the insulation layer, comprises a polymer composition comprising
(a) a polyolefin which is other than low density polyethylene (LDPE) and
(b) a second polyolefin which is different from the polyolefin (a).

"Low density polyethylene", LDPE, is a polyethylene produced in a high pressure polymerization process. Typically the polymerization of ethylene and optional further comonomer(s) in the high pressure process is carried out in the presence of an initiator(s). The meaning of LDPE polymer is well known and documented in the literature. Although the term LDPE is an abbreviation for low density polyethylene, the term is understood not to limit the density range, but covers the LDPE-like HP polyethylenes with low, medium and higher densities. The term LDPE describes and distinguishes only the nature of HP polyethylene with typical features, such as different branching architecture, compared to the PE produced in the presence of an olefin polymerisation catalyst.

Preferably the polymer composition is used in a layer of a HV power cable operating at voltages of 40 kV or higher, even at voltages of 50 kV or higher. More preferably, the polymer composition is used in a layer of a HV power cable operating at voltages of 60 kV or higher. The invention is also highly feasible in very demanding cable applications and can be used in a layer of a HV power cable operating at voltages higher than 70 kV. The upper limit is not limited. The practical upper limit can be up to 900 kV. The invention is advantageous for use in HV power cable applications operating from 75 to 400 kV, preferably 75 to 350 kV. The invention is also found to be advantageous even in demanding extra HV power cable applications operating 400 to 850 kV. The preferred HV or extra HV power cable at any of the above voltage ranges is a HV DC power cable or an extra HV DC power cable.

HV DC power cable as used below or in claims means herein either HV DC power cable, preferably with operating at voltages as defined above, or extra high HV DC power cable, preferably with operating at voltages as defined above. Thus the term covers independently the operating areas for both the HV DC cable also EHV DC cable applications.

The polymer composition of the invention is referred herein below also shortly as "polymer composition". The polymer components thereof as defined above are also shortly referred herein as "polyolefin (a)" and, respectively, "second polyolefin (b)"

The polymer composition has preferably an electrical conductivity of 160 fS/m or less, preferably of 150 fS/m or less, more preferably of 140 fS/m or less, more preferably of 130 fS/m or less, more preferably of 120 fS/m or less, more preferably of 110 fS/m or less, more preferably of 100 fS/m or less, more preferably of 90 fS/m or less, more preferably of 0.01 to 80 fS/m, when measured according to DC conductivity method (1) using a 1 mm thick plaque sample as described under "Determination Methods". In embodiments with demanding needs for electrical properties, e.g. when operating at high voltages, it is preferred that the polymer composition has even as low conductivity as of 0.01 to 70 fS/m, more preferably of 0.05 to 60 fS/m, more preferably of 0.05 to 50 fS/m, more preferably of 0.05 to 40 fS/m, more preferably of 0.05 to 30 fS/m, more preferably of 0.05 to 20.0 fS/m, more preferably of 0.05 to 15.0 fS/m, more preferably of 0.05 to 10.0 fS/m, when measured according to DC conductivity method (1) using a 1 mm thick plaque sample as described under "Determination Methods".

Accordingly, the invention is also directed to a method for reducing, i.e. for providing a low, electrical conductivity of a polymer composition of a power cable, preferably of a DC power cable, by producing at least one layer, preferably an insulation layer, using the polymer composition of the invention.

Preferably, the polymer composition comprises the polyolefin (a) in an amount of 0.1 to 99.9 wt %, preferably of 0.5 wt % or more, preferably of 0.5 to 80 wt %, more preferably of 1.0 to 70 wt %, more preferably of 1.0 to 50 wt %, more preferably of 1.0 to 40 wt %, more preferably of 1.0 to 30 wt %, more preferably of 1.0 to 25 wt %, even more preferably 1.0 to 20 wt %, even more preferable 1.0 to 17 wt %, based on the combined weight of the polyolefin (a) and the second polyolefin (b).

The polyolefin (a) is preferably a polyethylene polymerised in the presence of an olefin polymerisation catalyst and selected from an ethylene homopolymer or a copolymer of ethylene with one or more comonomer(s); or a homo- or copolymer of C3-20 alpha-olefin which is preferably selected from a propylene homopolymer, a random copolymer of propylene with one or more comonomer(s) or heterophasic copolymer of propylene with one or more comonomer(s), or from homo- or copolymers of butene. "Polyethylene polymerised in the presence of an olefin polymerisation catalyst" is also often called as "low pressure polyethylene" to distinguish it clearly from LDPE. Both expressions are well known in the polyolefin field.

According to one preferred embodiment, the polyolefin (a) is polyethylene selected from very low density polyethylene (VLDPE) copolymers, linear low density polyethylene (LLDPE) copolymers, medium density polyethylene (MDPE) copolymers or high density polyethylene (HDPE) homopolymers or copolymers. The low pressure polyethylene can be unimodal or multimodal with respect to molecular weight distribution.

According to another preferred embodiment, the polyolefin (a) is a propylene homopolymer, a random copolymer of propylene with one or more comonomer(s) or heterophasic copolymer of propylene with one or more comonomer(s).

The most preferred polyolefin (a) is a polyethylene polymerised in the presence of an olefin polymerisation catalyst and selected from an ethylene homopolymer or a copolymer of ethylene with one or more comonomer(s) as defined above or below. Even more preferably the polyolefin (a) is a MDPE polymer or a HDPE polymer, most preferably a HDPE polymer as defined above or below, even more preferably a HDPE polymer which is unimodal or multimodal with respect to molecular weight distribution as defined above or below.

Further preferably, the polymer composition comprises the polyolefin (b) in an amount of 0.1 to 99.9 wt %, preferably of 99.5 wt % or less, preferably of 20 to 99.5 wt %, more preferably of 30 to 99.0 wt %, more preferably of 50 to 99.0 wt %, more preferably of 60 to 99.0 wt %, more preferably of 70 to 99.0 wt %, more preferably of 75 to 99.0 wt %, even more preferably of 80 to 99.0 wt %, even more preferably of 83 to 99.0 wt %, based on the combined weight of the polyolefin (a) and the second polyolefin (b).

Preferably, the second polyolefin (b) is a polyolefin as defined for polyolefin (a) above or later below and is different from polyolefin (a), or is a low density polyethylene (LDPE) polymer selected from an optionally unsaturated LDPE homopolymer or an optionally unsaturated LDPE copolymer of ethylene with one or more comonomer(s). In the preferred embodiment of the polyolefin (b), the polyolefin (b) is an LDPE selected from an optionally unsaturated LDPE homopolymer or an optionally unsaturated LDPE copolymer of ethylene with one or more comonomer(s).

The polyolefin (a) and the second polyolefin (b) and the further properties and preferable embodiments thereof are further described later below.

Preferably, the polymer composition of the invention is crosslinkable.

"Crosslinkable" means that the polymer composition can be crosslinked using a crosslinking agent(s) before the use in the end application thereof. Crosslinkable polymer composition further comprises a crosslinking agent. It is preferred that the polyolefin (a) and the second polyolefin (b) of the polymer composition are crosslinked. Moreover, the crosslinked polymer composition or, respectively, the crosslinked polyolefin (a) and the second polyolefin (b), is most preferably crosslinked via radical reaction with a free radical generating agent. The crosslinked polymer composition has a typical network, i.a. interpolymer crosslinks (bridges), as well known in the field. As evident for a skilled person, the crosslinked polymer composition can be and is defined herein with features that are present in the polymer composition, polyolefin (a) or the second polyolefin (b) before or after the crosslinking, as stated or evident from the context. For instance the amount of the crosslinking agent in the polymer composition or a compositional property, such as MFR, density and/or unsaturation degree, of the polyolefin (a) or the second polyolefin (b) are defined, unless otherwise stated, before crosslinking "Crosslinked" means that the crosslinking step provides a further technical feature to the crosslinked polymer composition (product by process) which makes a further difference over prior art.

The Polymer composition has the beneficial low electrical conductivity also when it is crosslinked.

In embodiments, wherein the polymer composition comprises no crosslinking agent, the electrical conductivity as described under the "Determination method" is measured from a sample of said polymer composition which is non-crosslinked (i.e. does not contain a crosslinking agent and has not been crosslinked with a crosslinking agent). In embodiments, wherein the polymer composition is crosslinkable and comprises a crosslinking agent, then the electrical conductivity is measured from a sample of the crosslinked polymer composition (i.e. a sample of the polymer composition is first crosslinked with the crosslinking agent initially present is the polymer composition and then the electrical conductivity is measured from the obtained crosslinked sample). The conductivity measurement from a non-crosslinked or a crosslinked polymer composition sample is described under "Determination Methods". The amount of the crosslinking agent, if present, can vary, preferably within the ranges given below.

The expression "no crosslinking agent" means herein above and below that the polymer composition does not comprise any crosslinking agent which had been added to the polymer composition for the purpose of crosslinking the polymer composition.

Surprisingly, the polymer composition, wherein the crosslinked polymer composition comprising polyolefin (a), which is blended to the second polyolefin (b) has a reduced electrical conductivity compared to the electrical conductivity of a crosslinked second polyolefin (b) alone.

The crosslinking contributes preferably also to the mechanical properties and the heat and deformation resistance of the polymer composition.

Accordingly, the polymer composition preferably comprises crosslinking agent, preferably a peroxide. The polymer composition preferably comprises peroxide in an amount of up to 110 mmol —O—O—/kg polymer composition, preferably of up to 90 mmol —O—O—/kg polymer composition, more preferably of 0 to 75 mmol —O—O—/kg polymer composition, preferably of less than 50 mmol —O—O—/kg polymer composition, preferably of less than 40 mmol —O—O—/kg polymer composition.

In a preferred embodiment the polymer composition comprises peroxide in an amount of less than 37 mmol —O—O—/kg polymer composition, preferably of less than 35 mmol —O—O—/kg polymer composition, preferably of 0.1 to 34 mmol —O—O—/kg polymer composition, preferably of 0.5 to 33 mmol —O—O—/kg polymer composition, more preferably from 5.0 to 30 mmol —O—O—/kg polymer composition, more preferably from 7.0 to 30 mmol —O—O—/kg polymer composition, more preferably from 10.0 to 30 mmol —O—O—/kg polymer composition.

The unit "mmol —O—O—/kg polymer composition" means herein the content (mmol) of peroxide functional groups per kg polymer composition, when measured from the polymer composition prior to crosslinking. For instance the 35 mmol —O—O—/kg polymer composition corresponds to 0.95 wt % of the well known dicumyl peroxide based on the total amount (100 wt %) of the polymer composition.

With low peroxide content advantageously low electrical conductivity can be achieved and the prior art drawbacks relating to the use of a crosslinking agent in a cable layer can be minimised. Moreover, the used lower peroxide content can shorten the required degassing step of the produced and crosslinked cable, if desired.

Such polymer composition may comprise one type of peroxide or two or more different types of peroxide, in which case the amount (in mmol) of —O—O—/kg polymer composition, as defined above, below or in claims, is the sum of the amount of —O—O—/kg polymer composition of each peroxide type. As non-limiting examples of suitable organic peroxides, di-tert-amylperoxide, 2,5-di(tert-butylperoxy)-2,5-dimethyl-3-hexyne, 2,5-di(tert-butylperoxy)-2,5-dimethylhexane, tert-butylcumylperoxide, di(tert-butyl) peroxide, dicumylperoxide, butyl-4,4-bis(tert-butylperoxy)-valerate, 1,1-bis(tert-butylperoxy)-3,3,5-trimethylcyclohexane, tert-butylperoxybenzoate, dibenzoylperoxide, bis(tert butylperoxyisopropyl)benzene, 2,5-dimethyl-2,5-di(benzoylperoxy)hexane, 1,1-di(tert-butylperoxy)cyclohexane, 1,1-di(tert amylperoxy)cyclohexane, or any mixtures thereof, can be mentioned. Preferably, the peroxideis selected from 2,5-di(tert-butylperoxy)-2,5-dimethylhexane, di(tert-butylperoxyisopropyl)benzene, dicumylperoxide, tert-butylcumylperoxide, di(tert-butyl) peroxide, or mixtures thereof. Most preferably, the peroxide is dicumylperoxide.

Additionally, the polymer composition of the invention may contain, in addition to the polyolefin (a), second polyolefin (b) and the optional peroxide, further component(s) such as polymer component(s) and/or additive(s), preferably additive(s), such as any of antioxidant(s), scorch retarder(s) (SR), crosslinking booster(s), stabiliser(s), processing aid(s), flame retardant additive(s), water tree retardant additive(s), acid or ion scavenger(s), inorganic filler(s) and voltage stabilizer(s), as known in the polymer field. The polymer composition comprises preferably conventionally used additive(s) for W&C applications, such as one or more antioxidant(s) and optionally one or more of scorch retarder(s) or crosslinking booster(s), preferably at least one or more antioxidant(s). The used amounts of additives are conventional and well known to a skilled person.

As non-limiting examples of antioxidants e.g. sterically hindered or semi-hindered phenols, aromatic amines, aliphatic sterically hindered amines, organic phosphites or phosphonites, thio compounds, and mixtures thereof, can be mentioned.

The combined amount of polyolefin (a) and the second polyolefin (b) in the polymer composition of the invention is typically of at least 50 wt %, preferably from 80 to 100 wt % and more preferably from 85 to 100 wt %, of the total weight of the polymer component(s) present in the polymer composition. The preferred polymer composition consists of polyolefin (a) and the second polyolefin (b) as the only polymer components. The expression means that the polymer composition does not contain further polymer components, but the polyolefin (a) and the second polyolefin (b) as the sole polymer component(s). However, it is to be understood herein that the polymer composition may comprise further components other than the polyolefin (a) and the second polyolefin (b) components, such as additives which may optionally be added in a mixture with a carrier polymer, i.e. in so called master batch.

The polymer composition, preferably one or both of the polyolefin (a) and the second polyolefin (b), preferably the second polyolefin (b), may optionally be unsaturated (contain carbon-carbon double bonds) before the optional crosslinking, as further described below under the second polyolefin (b).

The invention also provides independently a subgroup of the polymer composition which comprises
(a) a polyolefin which is other than low density polyethylene (LDPE), and which is selected from a polyethylene produced in the presence of a olefin polymerisation catalyst or a polypropylene, preferably a MDPE polymer or a HDPE polymer, most preferably a HDPE polymer,
(b) a second polyolefin which is different from the polyolefin (a), preferably an LDPE polymer, more preferably an optionally unsaturated LDPE homopolymer or an optionally unsaturated LDPE copolymer of ethylene with one or more comonomer(s), and a peroxide in an amount of less than 37 mmol —O—O—/kg polymer composition, preferably of less than 35 mmol —O—O—/kg polymer composition, preferably of 0.1 to 34 mmol —O—O—/kg polymer composition, preferably of 0.5 to 33 mmol —O—O—/kg polymer composition, more preferably from 5.0 to 30 mmol —O—O—/kg polymer composition, more preferably from 7.0 to 30 mmol —O—O—/kg polymer composition, more preferably from 10.0 to 30 mmol —O—O—/kg polymer composition. This subgroup is preferably crosslinkable and, when crosslinked, provides highly reduced electrical conductivity. The subgroup of polymer composition is novel and preferred.

In this subgroup of the polymer composition the amount of the polyolefin (a) is preferably 50 wt % or less, more preferably of 1.0 to 40 wt %, more preferably of 1.0 to 30 wt %, more preferably of 1.0 to 25 wt %, even more preferably 1.0 to 20 wt %, based on the combined weight of the polyolefin (a) and the second polyolefin (b). Also preferably in this subgroup, the amount of the second polyolefin (b) is 50 wt % or more, more preferably of 60 to 99.0 wt %, more preferably of 70 to 99.0 wt %, more preferably of 75 to 99.0 wt %, even more preferably of 80 to 99.0 wt %, based on the combined weight of the polyolefin (a) and the second polyolefin (b).

This independent subgroup of the polymer composition of the invention is also preferred subgroup of the polymer composition of the invention present in at least one layer, preferably at least in the insulation layer, of the power cable of the invention as defined above, below or in claims.

In general, it is preferred that the polymer composition of the invention and the subgroup thereof as defined above, below or in claims are used for producing an insulation layer. Preferably, the polymer composition is avoid of, i.e. does not comprise, a carbon black. Also preferably, the polymer composition is avoid of, does not comprise, flame retarding additive(s) in such amounts conventionally used for acting as "flame retardants", e.g. a metal hydroxide containing additives in flame retarding amounts.

The following preferable embodiments, properties and subgroups of the polyolefin (a) and the second polyolefin (b) components suitable for the polymer composition are independently generalisable so that they can be used in any order or combination to further define the preferable embodiments of the polymer composition and the cable produced using the polymer composition. Moreover, it is evident that the given polyolefin (a) and (b) descriptions apply to the polyolefin prior optional crosslinking.

In case of the low pressure PE or PP, more preferably a low pressure PE, even more preferably a low pressure HDPE, as the preferred polyolefin (a), it is believed, however without binding to any theory, that the lamella thickness of crystals and the weight fraction of such crystals present in the low pressure PE or PP, more preferably in the low pressure PE, even more preferably in the low pressure HDPE, can further contribute to the reduced (=improved)

electrical conductivity (determined according to said DC conductivity method) of the polymer composition. Moreover, even when such preferred polyolefin (a) is used in small amounts in a polymer composition, it can contribute to the improved electrical conductivity property of the polymer composition. Accordingly, in one preferable embodiment the polymer composition comprises at least 3 wt % of crystals having a lamella thickness of at least 10 nm, when measured according to DSC method as described below under "Determination Methods". The upper limit of crystals having a lamella thickness of at least 10 nm is not limited and can be up to 100 wt %. More preferably in this embodiment the polymer composition has a weight fraction of crystals with lamella thickness >10 nm of at least 0.5 wt %, when measured according to DSC method as described below under "Determination Methods". More preferably in this embodiment, the polymer composition comprises a polyolefin (a) which is a low pressure PE or PP, more preferably a low pressure PE, even more preferably a low pressure HDPE, and which polyolefin (a) comprises at least 3 wt %, preferably at least 5 wt %, more preferably from 10 to 100 wt %, even more preferably from 15 to 95 wt %, of crystals with a lamella thickness of at least 10 nm, when measured according to DSC method as described below under "Determination Methods". Even more preferably in this embodiment, the polymer composition comprises a polyolefin (a) which is a low pressure PE or PP, more preferably a low pressure PE, even more preferably a low pressure HDPE, and which polyolefin (a) has a weight fraction of crystals with lamella thickness >10 nm of at least 1 wt %, more preferably of at least 3 wt %, even more preferably from 5 to 100 wt %, and most preferably from 10 to 95 wt %", when measured according to DSC method as described below under "Determination Methods. Such polymers are e.g. commercial and supplied for instance by Borealis, Ineos, Total Petrochemicals, Exxonmobil, Dow etc.

In this context the above used definitions have the following meanings.

"Lamella thickness"=Thickness of crystal lamellas in the material (fractions*<0.1 wt % are ignored).

*Refer to crystal fractions of one degree Celsius intervals.
"Crystal fraction with lamella thickness >10 nm"=Fraction of the crystals which have a thickness above 10 nm based on the amount of the crystallised part of the polymer
"Crystallinity"=wt % of the polymer that is crystalline
"Weight fraction of crystals with lamella thickness >10 nm [wt %]"=Crystal fraction with lamella thickness >10 nm"× "Crystallinity".
The defined properties are measured according to DSC method as described below under "Determination Methods".
Polyolefin (a)

Preferably the polyolefin (a) is a low pressure polyethylene, i.e. polyethylene polymerised in the presence of an olefin polymerisation catalyst; or a homo- or copolymer of C3-20 alpha-olefin which is preferably a polypropylene or a homo- or copolymers of butene. Most preferred polyolefin (a) is a low pressure polyethylene or polypropylene.

"Olefin polymerisation catalyst" means herein a conventional coordination catalyst. It is preferably selected from a Ziegler-Natta catalyst, single site catalyst which term comprises a metallocene and a non-metallocene catalyst, or a chromium catalyst, or any mixture thereof.

Term "Polyethylene" (PE) means homopolymer of ethylene or a copolymer of ethylene with one or more comonomer(s). "Polypropylene" (PP) means propylene homopolymer, a random copolymer of propylene with one or more comonomer(s) or heterophasic copolymer of propylene with one or more comonomer(s).

Low pressure PE or PP can be unimodal or multimodal with respect to molecular weight distribution (MWD=Mw/Mn). Generally, a polymer comprising at least two polymer fractions, which have been produced under different polymerization conditions resulting in different (weight average) molecular weights and molecular weight distributions for the fractions, is referred to as "multimodal". The prefix "multi" relates to the number of different polymer fractions present in the polymer. Thus, for example, multimodal polymer includes so called "bimodal" polymer consisting of two fractions. The form of the molecular weight distribution curve, i.e. the appearance of the graph of the polymer weight fraction as a function of its molecular weight, of a multimodal polymer will show two or more maxima or is typically distinctly broadened in comparison with the curves for the individual fractions. For example, if a polymer is produced in a sequential multistage process, utilizing reactors coupled in series and using different conditions in each reactor, the polymer fractions produced in the different reactors will each have their own molecular weight distribution and weight average molecular weight. When the molecular weight distribution curve of such a polymer is recorded, the individual curves from these fractions form typically together a broadened molecular weight distribution curve for the total resulting polymer product.

The term "multimodal" means herein, unless otherwise stated, multimodality at least with respect to molecular weight distribution (MWD=Mw/Mn) and includes also bimodal polymer.

A multimodal low pressure PE or PP usable in the present invention comprises a lower weight average molecular weight (LMW) component (A) and a higher weight average molecular weight (HMW) component (B). Said LMW component has a lower molecular weight than the HMW component.

Naturally, the multimodal low pressure PE or PP may in addition or alternatively to multimodality with respect to MWD be multimodal with respect to density and comonomer content. I.e. the LMW and HMW components may have different comonomer content or density, or both.

Preferably the low pressure PE and PP independently have a MWD of at least 2.0, preferably of at least 2.5, preferably of at least 2.9, preferably from 3 to 30, more preferably from 3.3 to 25, even more preferably from 3.5 to 20, preferably 3.5 to 15. A unimodal PE or PP has typically a MWD of 3.0 to 10.0.

The low pressure PE or PP can be a copolymer of ethylene or, respectively, of propylene (random or heterophasic), with one or more comonomer(s). Comonomer as used herein means monomer units other than ethylene or, respectively propylene, which are copolymerisable with ethylene or, respectively with propylene.

The low pressure PE copolymer is preferably a copolymer of ethylene with one or more olefin comonomer(s), preferably with at least C3-20 alpha olefin, more preferably with at least one C4-12 alpha-olefin, more preferably with at least one C4-8 alpha-olefin, e.g. with 1-butene, 1-hexene or 1-octene. The amount of comonomer(s) present in a PE copolymer is from 0.1 to 15 mol %, typically 0.25 to 10 mol-%.

The PP copolymer is preferably a copolymer of propylene with one or more olefin comonomer(s), preferably with at least one of ethylene or C4-20 alpha olefin, more preferably with at least one of ethylene or C4-12 alpha-olefin, more preferably with at least one of ethylene or C4-8 alpha-olefin, e.g. with ethylene, 1-butene, 1-hexene or 1-octene.

Preferably, the low pressure PE or PP copolymer can be a binary copolymer, i.e. the polymer contains ethylene and one comonomer, or a terpolymer, i.e. the polymer contains ethylene and two or three comonomers.

In one preferable embodiment the polyolefin (a) is a low pressure PE selected from a very low density ethylene copolymer (VLDPE), a linear low density ethylene copolymer (LLDPE), a medium density ethylene copolymer (MDPE) or a high density ethylene homopolymer or copolymer (HDPE). These well known types are named according to their density area. The term VLDPE includes herein PEs which are also known as plastomers and elastomers and covers the density range of from 850 to 909 kg/m$^3$. The LLDPE has a density of from 909 to 930 kg/m$^3$, preferably of from 910 to 929 kg/m$^3$, more preferably of from 915 to 929 kg/m$^3$. The MDPE has a density of from 930 to 945 kg/m$^3$, preferably 931 to 945 kg/m$^3$. The HDPE has a density of more than 945 kg/m$^3$, preferably of more than 946 kg/m$^3$, preferably form 946 to 977 kg/m$^3$, more preferably form 946 to 965 kg/m$^3$.

MDPE or HDPE are preferable types of low pressure PE for use as the polyolefin (a) of the present invention. More preferable polyolefin (a) is HDPE homopolymer or copolymer, preferably HDPE homopolymer. Such HDPE can unimodal or multimodal.

The low pressure PE has preferably an MFR$_2$ of up to 1200 g/10 min, such as of up to 1000 g/10 min, preferably of up to 500 g/10 min, preferably of up to 400 g/10 min, preferably of up to 300 g/10 min, preferably of up to 200 g/10 min, preferably of up to 150 g/10 min, preferably from 0.01 to 100, preferably from 0.01 to 50 g/10 min, preferably from 0.01 to 40.0 g/10 min, preferably of from 0.05 to 30.0 g/10 min, preferably of from 0.1 to 20.0 g/10 min, more preferably of from 0.2 to 15.0 g/10 min.

In another preferable embodiment the polyolefin (a) is a propylene homopolymer, a random copolymer of propylene with one or more comonomer(s) or heterophasic copolymer of propylene with one or more comonomer(s). The type of polypropylenes are well known in the field.

In "random copolymer" the comonomer(s) in said copolymer is distributed randomly, i.e. by statistical insertion of the comonomer units, within the copolymer chain. Said "heterophasic copolymer of propylene" comprises a matrix phase which can be a propylene homopolymer or a propylene copolymer, and an elastomeric phase of propylene copolymer, also known as rubber part, which is dispersed in said matrix phase.

A propylene homopolymer as the polyolefin (a) has typically a xylene soluble content (XS, in wt %) e.g. of below 5 wt %, such as 0.1 to 3 wt %, based on the amount of said propylene homopolymer.

A random propylene copolymer as the polyolefin (a) contains preferably conventionally used amounts of comonomer, for example up to 30 wt % of the amount of said random propylene copolymer, e.g. between 0.5 to 20 wt %, preferably 1.0 to 10 wt %, more preferably between 2.0 to 7 wt % based on the amount of said random propylene copolymer. The xylene solubles content (wt %) of said random propylene copolymer is preferably of up to 20 wt %, preferably of up to 15 wt %, e.g. 0.5 to 10 wt %, based on the amount of said random propylene copolymer.

A heterophasic propylene copolymer as the polyolefin (a) comprises the matrix phase of propylene homo- or copolymer of up to 95 wt %, preferably of from 20 to 90 wt %, the elastomeric propylene copolymer phase of up to 80 wt %, preferably of from 10 to 40 wt %, based on the amount of said heterophasic propylene copolymer. In case said matrix phase of said heterophasic propylene copolymer is a random propylene copolymer, then the comonomer content and XS (wt %) content of said matrix phase is preferably as defined above for said random copolymer as said polyolefin component (a). In case said matrix phase is a propylene homopolymer, then said XS (wt %) content is preferably as defined above for said propylene homopolymer component as said polyolefin component (a). The heterophasic propylene copolymer has typically a total xylene solubles (wt %) of up to 50 wt %, preferably of up to 30 wt %, based on the amount of the heterophasic propylene copolymer.

PP as the polyolefin (a) has preferably an MFR$_2$ of up to 1200 g/10 min, such as of up to 1000 g/10 min, preferably of up to 500 g/10 min, preferably of up to 400 g/10 min, preferably of up to 300 g/10 min, preferably of up to 200 g/10 min, preferably of up to 150 g/10 min, preferably from 0.01 to 100, preferably from 0.01 to 50 g/10 min, preferably from 0.01 to 40.0 g/10 min, preferably of from 0.05 to 30.0 g/10 min, preferably of from 0.1 to 20.0 g/10 min, more preferably of from 0.2 to 15.0 g/10 min.

The preferred polyolefin (a) is a polyethylene polymerised in the presence of an olefin polymerisation catalyst and selected from an ethylene homopolymer or a copolymer of ethylene with one or more comonomer(s) as defined above or below, including the above and below preferred subgroups thereof.

Suitable low pressure PE and PP as the polyolefin (a) are as such well known and can be e.g. commercially available or, alternatively, can be produced according to or analogously to conventional polymerisation processes which are well documented in the literature.

The catalyst can be selected from well known coordination catalysts, preferably from Ziegler Natta, single site, which term comprises well known metallocene and non-metallocene catalyst, or Chromium catalyst, or any mixtures thereof. It is evident for a skilled person that the catalyst system comprises a co-catalyst. Suitable Ziegler Natta catalysts for low pressure PE are described e.g. in EP0810235 or EP0688794 which are all incorporated by reference herein. Suitable Ziegler Natta catalysts for PP are described e.g. in WO03000754 or EP 1 484 345, which are all incorporated by reference herein. As known PP catalysts typically may contain internal or external donors. As well known the catalytically active catalyst component(s), such as the catalytically active component of the Ziegler Natta catalyst, is normally combined with an activator. Moreover the catalyst system can be non-supported or supported on a carrier, such as external carrier, like silica-based or Mg-based carrier.

The unimodal low pressure PE and PP can be produced by a single stage polymerisation in a single reactor in a well known and documented manner. The multimodal (e.g. bimodal) low pressure PE or PP can be produced e.g. by blending mechanically together two or more separate polymer components or, preferably, by in-situ blending during the polymerisation process of the components. Both mechanical and in-situ blending are well known in the field. Accordingly, the preferable in-situ blending means the polymerisation of the polymer components under different polymerisation conditions, e.g. in a multistage, i.e. two or more stage, polymerization or by the use of two or more different polymerization catalysts, including multi- or dual site catalysts, in a one stage polymerization, or by use a combination of multistage polymerisation and two or more different polymerisation catalysts. In the multistage polymerisation process the polymer is polymerised in a process comprising at least two polymerisation stages. Each polymerisation stage may be conducted in at least two distinct polymerisation zones in one reactor or in at least two separate reactors. Preferably, the multistage polymerisation process is conducted in at least two cascaded polymerisation zones. Polymerisation zones may be connected in parallel, or preferably the polymerisation zones operate in cascaded mode. The polymerisation zones may operate in bulk, slurry, solution, or gas phase conditions or in any combinations thereof. In the preferred multistage process a first polymerisation step is carried out in at least one slurry, e.g. loop, reactor and the second polymerisation step in one or more gas phase reactors. One preferable multistage process is described in EP517868. For suitable polypropylenes as said polyolefin (a) the preparation processes thereof, reference is also made to e.g. Nello Pasquini (Ed.) Polypropylene Handbook, Hanser, Munich, 2005, pages 15-141.

In general, the temperature in the low pressure PE and PP polymerisation is typically from 50 to 115° C., preferably from 60 to 110° C. The pressure is from 1 to 150 bar, preferably from 10 to 100 bar. The precise control of polymerisation conditions can be performed using different types of catalyst and using different comonomer and/or hydrogen feeds.

Prepolymerisation may precede the actual polymerisation step(s), as well known in the field.

In case of heterophasic copolymer of propylene the matrix of propylene homopolymer or random copolymer can be produced e.g. in a single stage or as a multistage process described above and the elastomeric (rubber) part of the propylene copolymer can be produced as an in-situ polymerisation e.g. in a separate reactor, e.g. gas phase reactor in the presence of the matrix polymer produced in the previous stage. Alternatively the elastomeric copolymer of propylene part can be mechanically compounded to the matrix phase material, as well known in the art.

The obtained low pressure PE or PP polymerisation product may be compounded in a known manner and optionally with additive(s) and pelletised for further use.

Second Polyolefin (b)

The second polyolefin (b) can be any polyolefin as defined for polyolefin (a) or a low density polyethylene (LDPE) polymer.

A suitable polyolefin as the second polyolefin (b) can be any polyolefin, such as any conventional polyolefin, which can be used in a cable layer, preferably in an insulating layer, of a cable, preferably of a power cable.

Suitable polyolefins as the second polyolefin (b) are e.g. as such well known and can be e.g. commercially available or can be prepared according to or analogously to known polymerization processes described in the chemical literature.

The preferred second polyolefin (b) is an LDPE polymer which may be a low density homopolymer of ethylene (referred herein as LDPE homopolymer) or a low density copolymer of ethylene with one or more comonomer(s) (referred herein as LDPE copolymer). The one or more comonomers of LDPE copolymer are preferably selected from the polar comonomer(s), non-polar comonomer(s) or from a mixture of the polar comonomer(s) and non-polar comonomer(s), as defined above or below. Moreover, said LDPE homopolymer or LDPE copolymer as said second polyolefin (b) may optionally be unsaturated.

As well known "comonomer" refers to copolymerisable comonomer units.

As a polar comonomer for the LDPE copolymer as said second polyolefin (b), comonomer(s) containing hydroxyl group(s), alkoxy group(s), carbonyl group(s), carboxyl group(s), ether group(s) or ester group(s), or a mixture thereof, can be used. More preferably, comonomer(s) containing carboxyl and/or ester group(s) are used as said polar comonomer. Still more preferably, the polar comonomer(s) of LDPE copolymer is selected from the groups of acrylate(s), methacrylate(s) or acetate(s), or any mixtures thereof. If present in said LDPE copolymer, the polar comonomer(s) is preferably selected from the group of alkyl acrylates, alkyl methacrylates or vinyl acetate, or a mixture thereof. Further preferably, said polar comonomers are selected from $C_1$- to $C_6$-alkyl acrylates, $C_1$- to $C_6$-alkyl methacrylates or vinyl acetate. Still more preferably, said polar LDPE copolymer is a copolymer of ethylene with $C_1$- to $C_4$-alkyl acrylate, such as methyl, ethyl, propyl or butyl acrylate, or vinyl acetate, or any mixture thereof.

As the non-polar comonomer(s) for the LDPE copolymer as said second polyolefin (b), comonomer(s) other than the above defined polar comonomers can be used. Preferably, the non-polar comonomers are other than comonomer(s) containing hydroxyl group(s), alkoxy group(s), carbonyl group(s), carboxyl group(s), ether group(s) or ester group(s). One group of preferable non-polar comonomer(s) comprise, preferably consist of, monounsaturated (=one double bond) comonomer(s), preferably olefins, preferably alpha-olefins, more preferably $C_3$ to $C_{10}$ alpha-olefins, such as propylene, 1-butene, 1-hexene, 4-methyl-1-pentene, styrene, 1-octene, 1-nonene; polyunsaturated (=more than one double bond) comonomer(s); a silane group containing comonomer(s); or any mixtures thereof. The polyunsaturated comonomer(s) are further described below in relation to unsaturated LDPE copolymers.

If the LDPE polymer is a copolymer, it preferably comprises 0.001 to 50 wt.-%, more preferably 0.05 to 40 wt.-%, still more preferably less than 35 wt.-%, still more preferably less than 30 wt.-%, more preferably less than 25 wt.-%, of one or more comonomer(s).

The polymer composition, preferably at least the second polyolefin (b) component thereof, more preferably the LDPE polymer, may optionally be unsaturated, i.e. the polymer composition, preferably at least the second polyolefin (b), preferably the LDPE polymer, may comprise carbon-carbon double bonds (—C=C—). The "unsaturated" means herein that the polymer composition, preferably the second polyolefin (b), contains carbon-carbon double bonds/1000 carbon atoms in a total amount of at least 0.4/1000 carbon atoms.

As well known, the unsaturation can be provided to the polymer composition i.a. by means of the polyolefin component(s), a low molecular weight (Mw) compound(s), such as crosslinking booster(s) or scorch retarder additive(s), or any combinations thereof. The total amount of double bonds means herein double bonds determined from the source(s) that are known and deliberately added to contribute to the unsaturation. If two or more above sources of double bonds are chosen to be used for providing the unsaturation, then the total amount of double bonds in the polymer composition means the sum of the double bonds present in the double-bond sources. It is evident that a characteristic model compound for calibration is used for each chosen source to enable the quantitative infrared (FTIR) determination.

Any double bond measurements are carried out prior to optional crosslinking.

If the polymer composition is unsaturated (prior to optional crosslinking), then it is preferred that the unsaturation originates at least from an unsaturated second polyolefin (b) component. More preferably, the unsaturated second polyolefin (b) is an unsaturated polyethylene, more preferably an unsaturated LDPE polymer, even more preferably an unsaturated LDPE homopolymer or an unsaturated LDPE copolymer. When polyunsaturated comonomer(s) are present in the LDPE polymer as said unsaturated polyolefin, then the LDPE polymer is an unsaturated LDPE copolymer.

In a preferred embodiment the term "total amount of carbon-carbon double bonds" is defined from the unsaturated second polyolefin (b), and refers, if not otherwise specified, to the combined amount of double bonds which originate from vinyl groups, vinylidene groups and trans-vinylene groups, if present. Naturally the second polyolefin (b) does not necessarily contain all the above three types of double bonds. However, any of the three types, when present, is calculated to the "total amount of carbon-carbon double bonds". The amount of each type of double bond is measured as indicated under "Determination methods".

If an LDPE homopolymer is unsaturated, then the unsaturation can be provided e.g. by a chain transfer agent (CTA), such as propylene, and/or by polymerization conditions. If an LDPE copolymer is unsaturated, then the unsaturation can be provided by one or more of the following means: by a chain transfer agent (CTA), by one or more polyunsaturated comonomer(s) or by polymerisation conditions. It is well known that selected polymerisation conditions such as peak temperatures and pressure, can have an influence on the unsaturation level. In case of an unsaturated LDPE copolymer, it is preferably an unsaturated LDPE copolymer of ethylene with at least one polyunsaturated comonomer, and optionally with other comonomer(s), such as polar comonomer(s) which is then preferably selected from acrylate or acetate comonomer(s). More preferably an unsaturated LDPE copolymer is an unsaturated LDPE copolymer of ethylene with at least polyunsaturated comonomer(s).

The polyunsaturated comonomers suitable for the unsaturated second polyolefin (b) preferably consist of a straight carbon chain with at least 8 carbon atoms and at least 4 carbons between the non-conjugated double bonds, of which at least one is terminal, more preferably, said polyunsaturated comonomer is a diene, preferably a diene which comprises at least eight carbon atoms, the first carbon-carbon double bond being terminal and the second carbon-carbon double bond being non-conjugated to the first one. Preferred dienes are selected from $C_8$ to $C_{14}$ non-conjugated dienes or mixtures thereof, more preferably selected from 1,7-octadiene, 1,9-decadiene, 1,11-dodecadiene, 1,13-tetradecadiene, 7-methyl-1,6-octadiene, 9-methyl-1,8-decadiene, or mixtures thereof. Even more preferably, the diene is selected from 1,7-octadiene, 1,9-decadiene, 1,11-dodecadiene, 1,13-tetradecadiene, or any mixture thereof, however, without limiting to above dienes.

It is well known that e.g. propylene can be used as a comonomer or as a chain transfer agent (CTA), or both, whereby it can contribute to the total amount of the carbon-carbon double bonds, preferably to the total amount of the vinyl groups. Herein, when a compound which can also act as comonomer, such as propylene, is used as CTA for providing double bonds, then said copolymerisable comonomer is not calculated to the comonomer content.

If the second polyolefin (b), more preferably the LDPE polymer, is unsaturated, then it has preferably a total amount of carbon-carbon double bonds, which originate from vinyl groups, vinylidene groups and trans-vinylene groups, if present, of more than 0.4/1000 carbon atoms, preferably of more than 0.5/1000 carbon atoms. The upper limit of the amount of carbon-carbon double bonds present in the polyolefin is not limited and may preferably be less than 5.0/1000 carbon atoms, preferably less than 3.0/1000 carbon atoms.

In some embodiments, e.g. wherein higher crosslinking level with the low peroxide content is desired, the total amount of carbon-carbon double bonds, which originate from vinyl groups, vinylidene groups and trans-vinylene groups, if present, in the unsaturated LDPE, is preferably higher than 0.40/1000 carbon atoms, preferably higher than 0.50/1000 carbon atoms, preferably higher than 0.60/1000 carbon atoms.

In a very preferable embodiment the second polyolefin (b) is unsaturated LDPE polymer as defined above and the polymer composition contains the preferable "low" peroxide content of the invention as defined above or in claims. Higher double bond content combined with the preferable "low" peroxide content further contributes to the low electrical conductivity. The embodiment is also preferable e.g. if high cable production speed or longer extrusion time, or both, is desired. The embodiment also contributes to the desirable mechanical and/or heat resistance properties are needed for the layer, preferably insulation layer, material.

More preferably the second polyolefin (b) is unsaturated LDPE as defined above and contains at least vinyl groups and the total amount of vinyl groups is preferably higher than 0.05/1000 carbon atoms, still more preferably higher than 0.08/1000 carbon atoms, and most preferably of higher than 0.11/1000 carbon atoms. Preferably, the total amount of vinyl groups is of lower than 4.0/1000 carbon atoms. More preferably, the second polyolefin (b), prior to crosslinking, contains vinyl groups in total amount of more than 0.20/1000 carbon atoms, still more preferably of more than 0.30/1000 carbon atoms.

The preferred second polyolefin (b) for use in the polymer composition is an unsaturated LDPE copolymer of ethylene with at least one polyunsaturated comonomer, preferably a diene as defined above, and optionally with other comonomer(s), and has the total amount of carbon-carbon double bonds, which originate from vinyl groups, vinylidene groups and trans-vinylene groups, if present, as defined above, preferably has the total amount of vinyl groups as defined above. Said unsaturated LDPE copolymer is highly usable for the invention for use as the second polyolefin (b) of a polymer composition, preferable in an insulation layer of a power cable, preferably of a DC power cable.

Typically, and preferably in wire and cable (W&C) applications, the density of the second polyolefin (b), preferably of the LDPE polymer, is higher than 860 kg/m$^3$. Preferably the density of the second polyolefin (b), preferably of the LDPE homopolymer or copolymer, is not higher than 960 kg/m$^3$, and preferably is from 900 to 945 kg/m$^3$. The MFR$_2$ (2.16 kg, 190° C.) of the second polyolefin (b), preferably of the LDPE polymer, is preferably from 0.01 to 50 g/10 min, more preferably from 0.01 to 40.0 g/10, more preferably is from 0.1 to 20 g/10 min, and most preferably is from 0.2 to 10 g/10 min.

Accordingly, the second polyolefin (b) of the invention is a LDPE polymer, which is preferably produced at high pressure by free radical initiated polymerisation (referred to as high pressure (HP) radical polymerization). The HP reactor can be e.g. a well known tubular or autoclave reactor or a mixture thereof, preferably a tubular reactor. The high pressure (HP) polymerisation and the adjustment of process conditions for further tailoring the other properties of the polyolefin depending on the desired end application are well known and described in the literature, and can readily be used by a skilled person. Suitable polymerisation temperatures range up to 400° C., preferably from 80 to 350° C. and pressure from 70 MPa, preferably 100 to 400 MPa, more preferably from 100 to 350 MPa. Pressure can be measured at least after compression stage and/or after the tubular reactor. Temperature can be measured at several points during all steps.

After the separation the obtained LDPE is typically in a form of a polymer melt which is normally mixed and pelletized in a pelletising section, such as pelletising extruder, arranged in connection to the HP reactor system. Optionally, additive(s), such as antioxidant(s), can be added in this mixer in a known manner.

Further details of the production of ethylene (co)polymers by high pressure radical polymerization can be found i.a. in the Encyclopedia of Polymer Science and Engineering, Vol. 6 (1986), pp 383-410 and Encyclopedia of Materials: Science and Technology, 2001 Elsevier Science Ltd.: "Polyethylene: High-pressure, R. Klimesch, D. Littmann and F.-O. Mähling pp. 7181-7184.

When an unsaturated LDPE copolymer of ethylene is prepared, then, as well known, the carbon-carbon double bond content can be adjusted by polymerising the ethylene e.g. in the presence of one or more polyunsaturated comonomer(s), chain transfer agent(s), or both, using the desired feed ratio between monomer, preferably ethylene, and polyunsaturated comonomer and/or chain transfer agent, depending on the nature and amount of C—C double bonds desired for the unsaturated LDPE copolymer. I.a. WO 9308222 describes a high pressure radical polymerisation of ethylene with polyunsaturated monomers. As a result the unsaturation can be uniformly distributed along the polymer chain in random copolymerisation manner. Also e.g. WO 9635732 describes high pressure radical polymerisation of ethylene and a certain type of polyunsaturated α,ω-divinylsiloxanes.

End Uses and End Applications of the Polymer Composition of Invention

The polymer composition of the invention can be used for producing a layer of a power cable, preferably a direct current (DC) power cable, as defined above, below or in claims.

The invention further provides a power cable, preferably a direct current (DC) power cable, comprising a conductor which is surrounded at least by an inner semiconductive layer, an insulation layer and an outer semiconductive layer, in that order, wherein at least one layer, preferably at least the insulation layer, comprises, preferably consists of, a polymer composition as defined above, below or in claims comprising
(a) a polyolefin which is other than low density polyethylene (LDPE) and
(b) a second polyolefin, which is different from the polyolefin (a).

Accordingly, the inner semiconductive layer of the power cable comprises, preferably consists of, a first semiconductive composition, the insulation layer comprises, preferably consists of, an insulation composition, and the outer semiconductive layer comprises, preferably consists of, a second semiconductive composition. Thus one of the compositions, preferably at least the insulation composition comprises, more preferably, consists of the polymer composition of the invention.

The term "conductor" means herein above and below that the conductor comprises one or more wires. Moreover, the cable may comprise one or more such conductors. Preferably the conductor is an electrical conductor and comprises one or more metal wires.

The first and the second semiconductive compositions can be different or identical and comprise a polymer(s) which is preferably a polyolefin or a mixture of polyolefins and a conductive filler, preferably carbon black. Suitable polyolefin(s) are e.g. polyethylene produced in a low pressure process or a polyethylene produced in a HP process (LDPE). The general polymer description as given above in relation to the polyolefin (a) and, respectively, in relation to the second optional polyolefin (b) apply also for the suitable polymers for semiconductive layers. The carbon black can be any conventional carbon black used in the semiconductive layers of a power cable, preferably in the semiconductive layer of a DC power cable. Preferably the carbon black has one or more of the following properties: a) a primary particle size of at least 5 nm which is defined as the number average particle diameter according ASTM D3849-95a, dispersion procedure D b) iodine number of at least 30 mg/g according to ASTM D1510, c) oil absorption number of at least 30 ml/100 g which is measured according to ASTM D2414. Non-limiting examples of carbon blacks are e.g. acetylene carbon black, furnace carbon black and Ketjen carbon black, preferably furnace carbon black and acetylene carbon black. Preferably, the polymer composition comprises 10 to 50 wt % carbon black, based on the weight of the Semiconductive composition.

The power cable, preferably the DC power cable, of the invention is preferably crosslinkable, wherein at least one layer, preferably at least the insulation layer, comprises, preferably consists of, the polymer composition as defined above, below or in claims comprising
(a) a polyolefin which is other than low density polyethylene (LDPE),
(b) a second polyolefin, which is different from the polyolefin (a), as defined above or in claims, and
a crosslinking agent, preferably a peroxide in an amount of up to 110 mmol —O—O—/kg polymer composition, preferably of up to 90 mmol —O—O—/kg polymer composition, more preferably of 1.0 to 75 mmol —O—O—/kg polymer composition, preferably of less than 50 mmol —O—O—/kg polymer composition, preferably of less than 40 mmol —O—O—/kg polymer composition, preferably of less than 37 mmol —O—O—/kg polymer composition, preferably of less than 35 mmol —O—O—/kg polymer composition, preferably of 0.1 to 34 mmol-O—O—/kg polymer composition, preferably of 0.5 to 33 mmol —O—O—/kg polymer composition, more preferably from 5.0 to 30 mmol —O—O—/kg polymer composition, more preferably from 7.0 to 30 mmol —O—O—/kg polymer composition, more preferably from 10.0 to 30 mmol —O—O—/kg polymer composition.

Naturally, the further preferable subgroups of the above properties, further properties, variants and embodiments as defined above or below for the polymer composition or for the polyolefin (a) and the second polyolefin (b) components thereof apply similarly to the power cable, preferably to the DC power cable, of the invention.

As well known the cable can optionally comprise further layers, e.g. layers surrounding the insulation layer or, if present, the outer semiconductive layers, such as screen(s), a jacketing layer(s), other protective layer(s) or any combinations thereof.

The invention also provides a process for producing a power cable, more preferably a DC power cable, as defined above or in claims, which is preferably crosslinkable, whereby the process comprises the steps of
applying on a conductor, preferably by (co)extrusion, at least one layer, preferably an inner semiconductive layer comprising a first semiconductive composition, an insulation layer comprising an insulation composition and an outer semiconductive layer comprising a second semiconductive composition, in that order, wherein the composition of at least one layer, preferably of the insulation layer comprises, preferably consists of, the polymer composition comprising (a) a polyolefin which is other than low density polyethylene (LDPE), (b) a second polyolefin which is different from the polyolefin (a), as defined above or in claims, and optionally, and preferably, a crosslinking agent, which is preferably a peroxide in an amount of up to 110 mmol —O—O—/kg polymer composition, preferably of up to 90 mmol —O—O—/kg polymer composition, more preferably of 0 to 75 mmol —O—O—/kg polymer composition, preferably of less than 50 mmol —O—O—/kg polymer composition, preferably of less than 40 mmol —O—O—/kg polymer composition, preferably of less than 37 mmol —O—O—/kg polymer composition, preferably of less than 35 mmol —O—O—/kg polymer composition, preferably of 0.1 to 34 mmol —O—O—/kg polymer composition, preferably of 0.5 to 33 mmol —O—O—/kg polymer composition, more preferably from 5.0 to 30 mmol —O—O—/kg polymer composition, more preferably from 7.0 to 30 mmol —O—O—/kg polymer composition, more preferably from 10.0 to 30 mmol —O—O—/kg polymer composition. Preferably, the polymer composition comprises the crosslinking agent and the process comprises a further step of crosslinking at least the polymer composition of said insulation layer, in the presence of the crosslinking agent, preferably in an amount as defined above, at crosslinking conditions, and optionally, and preferably, crosslinking at least one, preferably both, of the first semiconductive composition of the inner semiconductive layer and the second semiconductive composition of the outer semiconductive layer, in the presence of a crosslinking agent at crosslinking conditions.

More preferably, a crosslinkable DC power cable, preferably a crosslinkable HV DC power cable, is produced, wherein the process comprises the steps of (a)

providing and mixing, preferably meltmixing in an extruder, an optionally, and preferably, crosslinkable first semiconductive composition comprising a polymer, a carbon black and optionally further component(s) for the inner semiconductive layer, providing and mixing, preferably meltmixing in an extruder, a crosslinkable polymer composition of the invention for the insulation layer, providing and mixing, preferably meltmixing in an extruder, an optionally, and preferably, crosslinkable second semiconductive composition comprising a polymer, a carbon black and optionally further component(s) for the outer semiconductive layer, (b) applying on a conductor, preferably by coextrusion, a meltmix of the first semiconductive composition obtained from step (a) to form the inner semiconductive layer, a meltmix of polymer composition of the invention obtained from step (a) to form the insulation layer, and a meltmix of the second semiconductive composition obtained from step (a) to form the outer semiconductive layer, and (c) optionally crosslinking in the presence of a crosslinking agent and at crosslinking conditions one or more of the polymer composition of the insulation layer, the first semiconductive composition of the inner semiconductive layer and the second semiconductive composition of the outer semiconductive layer, of the obtained cable, preferably at least the polymer composition of the insulation layer, more preferably the polymer composition of the insulation layer, the first semiconductive composition of the inner semiconductive layer and the second semiconductive composition of the outer semiconductive layer.

Melt mixing means mixing above the melting point of at least the major polymer component(s) of the obtained mixture and is carried out for example, without limiting to, in a temperature of at least 15° C. above the melting or softening point of polymer component(s).

The term "(co)extrusion" means herein that in case of two or more layers, said layers can be extruded in separate steps, or at least two or all of said layers can be coextruded in a same extrusion step, as well known in the art. The term "(co)extrusion" means herein also that all or part of the layer(s) are formed simultaneously using one or more extrusion heads. For instance a triple extrusion can be used for forming three layers. In case a layer is formed using more than one extrusion heads, then for instance, the layers can be extruded using two extrusion heads, the first one for forming the inner semiconductive layer and the inner part of the insulation layer, and the second head for forming the outer insulation layer and the outer semiconductive layer.

As well known, the polymer composition of the invention and the optional and preferred first and second semiconductive compositions can be produced before or during the cable production process. Moreover the polymer composition of the invention and the optional and preferred first and second semiconductive composition can each independently comprise part or all of the component(s) of the final composition, before introducing to the (melt)mixing step a) of the cable production process.

Preferably, the polymer composition of the invention and, optionally, the optional first and second semiconductive composition are provided to the cable production process in form of powder, grain or pellets. Pellets mean herein generally any polymer product which is formed from reactor-made polymer (obtained directly from the reactor) by post-reactor modification to a solid polymer particles. A well-known post-reactor modification is pelletising a meltmix of a polymer product and optional additive(s) in a pelletising equipment to solid pellets. Pellets can be of any size and shape. Moreover, the polyolefin components (a) and (b) can be combined in a same powder, grain or pellet product, which thus contains a solid polymer mixture of the polyolefin (a) and the second polyolefin (b). Alternatively and preferably, the polyolefin (a) and the second polyolefin (b) are provided separately, e.g. as two separate pellet products, to the cable production process. All or part of the optional additives can be present in any such powder, grain or pellets or added separately.

Accordingly, the polyolefin (a) and the second polyolefin (b) of the polymer composition can be premixed, e.g. meltmixed together and pelletised, before providing to the mixing step (a). Alternatively, and preferably, these components can be provided e.g. in separate pellets to the (melt)mixing step (a), where the pellets are blended together.

The (melt)mixing step (a) of the provided polymer composition of the invention and of the preferable first and second semiconductive compositions is preferably carried out in a cable extruder. The step a) of the cable production process may optionally comprise a separate mixing step, e.g. in a mixer arranged in connection and preceding the cable extruder of the cable production line. Mixing in the preceding separate mixer can be carried out by mixing with or without external heating (heating with an external source) of the component(s). In case one of the polyolefin (a) or the second polyolefin (b), or the optional and preferable peroxide(s) and part or all of the optional further component(s), such as further additive(s), of the polymer composition of the invention and, respectively, part or all of the component(s) of the first or second semiconductive compositions, are added to the polyolefin during the cable production process, then the addition(s) can take place at any stage during the mixing step (a), e.g at the optional separate mixer preceding the cable extruder or at any point(s) of the cable extruder. The addition of the optional peroxide and optional additive(s) can be made simultaneously or separately as such, preferably in liquid form, or in a well known master batch, and at any stage during the mixing step (a).

The polymer composition preferably comprises a crosslinking agent, which is preferably peroxide. The crosslinking agent can be added before the cable production process or during the (melt)mixing step (a). For instance, and preferably, the crosslinking agent and also the optional further component(s), such as additive(s), can already be present in at least one of the polyolefin (a) or the second polyolefin (b) before the use in the production line of the cable production process. The crosslinking agent can be e.g. meltmixed together with the polyolefin (a) or the second polyolefin (b), or both, or a mixture thereof, and optional further component(s), and then the meltmix is pelletised. Alternatively and preferably, the crosslinking agent is added, preferably impregnated, to the solid polymer particles, preferably pellets, of the polyolefin component or of the polymer composition.

It is preferred that the meltmix of the polymer composition obtained from meltmixing step (a) consists of the polyolefin (a) and the second polyolefin (b) of the invention as the sole polymer components. The optional, and preferable, additive(s) can be added to polymer composition as such or as a mixture with a carrier polymer, i.e. in a form of so-called master batch.

In a preferred embodiment of the cable production process, a crosslinkable power cable, preferably a crosslinkable DC power cable, more preferably a crosslinkable HV DC power cable, is produced, wherein the insulation layer comprises, preferably consists of, a crosslinkable polymer composition of the invention which comprises a peroxide in an amount as given above or below, and wherein the second polyolefin (b) is optionally, and preferably, an unsaturated LDPE homo or copolymer, and wherein at least the crosslinkable insulation layer of the obtained cable is crosslinked in step c) at crosslinking conditions.

More preferably in this crosslinkable embodiment, also a crosslinked power cable, preferably a crosslinked DC power cable, more preferably a crosslinked HV DC power cable, is provided.

Crosslinking of the polymer composition of the insulation layer is preferably carried out in the presence of a peroxide in an amount as defined above or in below claims, and the optional and preferable crosslinking of the first semiconductive composition of the inner semiconductive, is carried out in the presence of crosslinking agent(s), preferably in the presence of free radical generating agent(s), which is preferably a peroxide(s).

The crosslinking agent(s) can already be present in the optional first and second semiconductive composition before introducing to the crosslinking step c) or introduced during the crosslinking step. Peroxide is the preferred crosslinking agent for said optional first and second semiconductive compositions and is preferably included to the pellets of semiconductive composition before the composition is used in the cable production process as described above.

Crosslinking can be carried out at increased temperature which is chosen, as well known, depending on the type of crosslinking agent. For instance temperatures above 150° C., such as from 160 to 350° C., are typical, however without limiting thereto.

The processing temperatures and devices are well known in the art, e.g. conventional mixers and extruders, such as single or twin screw extruders, are suitable for the process of the invention.

The invention further provides a crosslinked power cable, preferably a direct current (DC) power cable, preferably a crosslinked HV DC power cable, where the inner semiconductive layer comprises, preferably consists of, an optionally crosslinked first semiconductive composition, the polymer composition of the insulation layer comprises, preferably consists of, a crosslinked polymer composition of the invention as defined above or in claims, and the outer semicoductive layer comprises, preferably consists of, an optionally crosslinked second semiconductive composition, more preferably where the inner semiconductive layer comprises, preferably consists of, a crosslinked first semiconductive composition, the polymer composition of the insulation layer comprises, preferably consists of, a crosslinked polymer composition according to any of the preceding claims, and the outer semicoductive layer comprises, preferably consists of, an optionally crosslinked, preferably a crosslinked second semiconductive composition.

The non-crosslinked, or preferably crosslinked, power cable comprising the non-crosslinked, or preferably crosslinked, polymer composition of the invention in at least one cable layer, preferably in an insulation layer, has, i.a.

The advantageous electrical properties,

If the polymer composition of the invention is crosslinked, then the preferred low peroxide content prior crosslinking enables robust high speed extrusion possible leading to longer stable production periods at higher extrusion speed and quality due to lowered (or no) risk to scorching (undesired premature crosslinking) of the polymer composition in the extruder and/or in the layer(s), If the polymer composition of the invention is crosslinked, then the preferable low peroxide content results in lesser amounts of any undesired by-products, i.e. decomposition products, formed from the crosslinking agent. Thus degassing step can be reduced, which accelerates the overall cable production process, The power cable, when non-crosslinked or crosslinked with the preferred lower peroxide content, has good mechanical properties and thermal crack initiation properties, expressed as TSCR (Thermal stress cracking), which are unexpectedly sufficient for DC cable applications.

The preferred DC power cable of the invention is a HV DC power cable. Preferably the HV DC power cable operates at voltages as defined above for HV DC cable or extra HV DC cable, depending on the desired end cable application.

Moreover, the power cable, preferably the DC power cable, more preferably the HV DC power cable, of the invention is crosslinked as described above.

The thickness of the insulation layer of the DC power cable, more preferably of the HV DC power cable, is typically 2 mm or more, preferably at least 3 mm, preferably of at least 5 to 100 mm, more preferably from 5 to 50 mm, and conventionally 5 to 40 mm, e.g. 5 to 35 mm, when measured from a cross section of the insulation layer of the cable. The thickness of the inner and outer semiconductive layers is typically less than that of the insulation layer, and in HV DC power cables can be e.g. more than 0.1 mm, such as from 0.3 up to 20 mm, 0.3 to 10 of inner semiconductive and outer semiconductive layer. The thickness of the inner semiconductive layer is preferably 0.3-5.0 mm, preferably 0.5-3.0 mm, preferably 0.8-2.0 mm. The thickness of the outer semiconductive layer is preferably from 0.3 to 10 mm, such as 0.3 to 5 mm, preferably 0.5 to 3.0 mm, preferably 0.8-3.0 mm. It is evident for and within the skills of a skilled person that the thickness of the layers of the DC cable depends on the intended voltage level of the end application cable and can be chosen accordingly.

Determination Methods

Unless otherwise stated in the description or experimental part the following methods were used for the property determinations.

Wt %: % by weight

Melt Flow Rate

The melt flow rate (MFR) is determined according to ISO 1133 and is indicated in g/10 min. The MFR is an indication of the flowability, and hence the processability, of the polymer. The higher the melt flow rate, the lower the viscosity of the polymer. The MFR is determined at 190° C. for polyethylene and at 230° C. for polypropylene. MFR may be determined at different loadings such as 2.16 kg ($MFR_2$) or 21.6 kg ($MFR_{21}$).

Molecular Weight

Mz, Mw, Mn, and MWD are measured by Gel Permeation Chromatography (GPC) according to the following method:

The weight average molecular weight Mw and the molecular weight distribution (MWD=Mw/Mn wherein Mn is the number average molecular weight and Mw is the weight average molecular weight; Mz is the z-average molecular weight) is measured according to ISO 16014-4: 2003 and ASTM D 6474-99. A Waters GPCV2000 instrument, equipped with refractive index detector and online viscosimeter was used with 2×GMHXL-HT and 1× G7000HXL-HT TSK-gel columns from Tosoh Bioscience and 1,2,4-trichlorobenzene (TCB, stabilized with 250 mg/L 2,6-Di tert-butyl-4-methyl-phenol) as solvent at 140° C. and at a constant flow rate of 1 mL/min. 209.5 μL of sample solution were injected per analysis. The column set was calibrated using universal calibration (according to ISO 16014-2:2003) with at least 15 narrow MWD polystyrene (PS) standards in the range of 1 kg/mol to 12 000 kg/mol. Mark Houwink constants were used as given in ASTM D 6474-99. All samples were prepared by dissolving 0.5-4.0 mg of polymer in 4 mL (at 140° C.) of stabilized TCB (same as mobile phase) and keeping for max. 3 hours at a maximum temperature of 160° C. with continuous gentle shaking prior sampling in into the GPC instrument.

Comonomer Contents a) Comonomer Content in Random Copolymer of Polypropylene:

Quantitative Fourier transform infrared (FTIR) spectroscopy was used to quantify the amount of comonomer. Calibration was achieved by correlation to comonomer contents determined by quantitative nuclear magnetic resonance (NMR) spectroscopy.

The calibration procedure based on results obtained from quantitative $^{13}$C-NMR spectroscopy was undertaken in the conventional manner well documented in the literature. The amount of comonomer (N) was determined as weight percent (wt %) via:

$$N=k1(A/R)+k2$$

wherein A is the maximum absorbance defined of the comonomer band, R the maximum absorbance defined as peak height of the reference peak and with k1 and k2 the linear constants obtained by calibration. The band used for ethylene content quantification is selected depending if the ethylene content is random (730 $cm^{-1}$) or block-like (as in heterophasic PP copolymer) (720 $cm^{-1}$). The absorbance at 4324 $cm^{-1}$ was used as a reference band.

b) Quantification of Alpha-Olefin Content in Linear Low Density Polyethylenes and Low Density Polyethylenes by NMR Spectroscopy:

The comonomer content was determined by quantitative 13C nuclear magnetic resonance (NMR) spectroscopy after basic assignment (J. Randall JMS-Rev. Macromol. Chem. Phys., C29(2&3), 201-317 (1989). Experimental parameters were adjusted to ensure measurement of quantitative spectra for this specific task.

Specifically solution-state NMR spectroscopy was employed using a Bruker AvanceIII 400 spectrometer. Homogeneous samples were prepared by dissolving approximately 0.200 g of polymer in 2.5 ml of deuterated-tetrachloroethene in 10 mm sample tubes utilising a heat block and rotating tube oven at 140 C. Proton decoupled 13C single pulse NMR spectra with NOE (powergated) were recorded using the following acquisition parameters: a flip-angle of 90 degrees, 4 dummy scans, 4096 transients an acquisition time of 1.6 s, a spectral width of 20 kHz, a temperature of 125 C, a bilevel WALTZ proton decoupling scheme and a relaxation delay of 3.0 s. The resulting FID was processed using the following processing parameters: zero-filling to 32 k data points and apodisation using a gaussian window function; automatic zeroth and first order phase correction and automatic baseline correction using a fifth order polynomial restricted to the region of interest.

Quantities were calculated using simple corrected ratios of the signal integrals of representative sites based upon methods well known in the art.

c) Comonomer Content of Polar Comonomers in Low Density Polyethylene (1) Polymers Containing >6 wt. % Polar Comonomer Units Comonomer content (wt %) was determined in a known manner based on Fourier transform infrared spectroscopy (FTIR) determination calibrated with quantitative nuclear magnetic resonance (NMR) spectroscopy. Below is exemplified the determination of the polar comonomer content of ethylene ethyl acrylate, ethylene butyl acrylate and ethylene methyl acrylate. Film samples of the polymers were prepared for the FTIR measurement: 0.5-0.7 mm thickness was used for ethylene butyl acrylate and ethylene ethyl acrylate and 0.10 mm film thickness for ethylene methyl acrylate in amount of >6 wt %. Films were pressed using a Specac film press at 150° C., approximately at 5 tons, 1-2 minutes, and then cooled with cold water in a not controlled manner. The accurate thickness of the obtained film samples was measured.

After the analysis with FTIR, base lines in absorbance mode were drawn for the peaks to be analysed. The absorbance peak for the comonomer was normalised with the absorbance peak of polyethylene (e.g. the peak height for butyl acrylate or ethyl acrylate at 3450 $cm^{-1}$ was divided with the peak height of polyethylene at 2020 $cm^{-1}$). The NMR spectroscopy calibration procedure was undertaken in the conventional manner which is well documented in the literature, explained below.

For the determination of the content of methyl acrylate a 0.10 mm thick film sample was prepared. After the analysis the maximum absorbance for the peak for the methylacrylate at 3455 cm$^{-1}$ was subtracted with the absorbance value for the base line at 2475 cm$^{-1}$ ($A_{methylacrylate}$–$A_{2475}$). Then the maximum absorbance peak for the polyethylene peak at 2660 cm$^{-1}$ was subtracted with the absorbance value for the base line at 2475 cm$^{-1}$ ($A_{2660}$–$A_{2475}$). The ratio between ($A_{methylacrylate}$–$A_{2475}$) and ($A_{2660}$–$A_{2475}$) was then calculated in the conventional manner which is well documented in the literature.

The weight-% can be converted to mol-% by calculation. It is well documented in the literature.

Quantification of Copolymer Content in Polymers by NMR Spectroscopy

The comonomer content was determined by quantitative nuclear magnetic resonance (NMR) spectroscopy after basic assignment (e.g. "NMR Spectra of Polymers and Polymer Additives", A. J. Brandolini and D. D. Hills, 2000, Marcel Dekker, Inc. New York). Experimental parameters were adjusted to ensure measurement of quantitative spectra for this specific task (e.g "200 and More NMR Experiments: A Practical Course", S. Berger and S. Braun, 2004, Wiley-VCH, Weinheim). Quantities were calculated using simple corrected ratios of the signal integrals of representative sites in a manner known in the art.

(2) Polymers Containing 6 wt. % or Less Polar Comonomer Units

Comonomer content (wt. %) was determined in a known manner based on Fourier transform infrared spectroscopy (FTIR) determination calibrated with quantitative nuclear magnetic resonance (NMR) spectroscopy. Below is exemplified the determination of the polar comonomer content of ethylene butyl acrylate and ethylene methyl acrylate. For the FT-IR measurement a film samples of 0.05 to 0.12 mm thickness were prepared as described above under method 1). The accurate thickness of the obtained film samples was measured.

After the analysis with FT-IR base lines in absorbance mode were drawn for the peaks to be analysed. The maximum absorbance for the peak for the comonomer (e.g. for methylacrylate at 1164 cm$^{-1}$ and butylacrylate at 1165 cm$^{-1}$) was subtracted with the absorbance value for the base line at 1850 cm$^{-1}$ ($A_{polar\ comonomer}$–$A_{1850}$). Then the maximum absorbance peak for polyethylene peak at 2660 cm$^{-1}$ was subtracted with the absorbance value for the base line at 1850 cm$^{-1}$ ($A_{2660}$–$A_{1850}$). The ratio between ($A_{comonomer}$–$A_{1850}$) and ($A_{2660}$–$A_{1850}$) was then calculated. The NMR spectroscopy calibration procedure was undertaken in the conventional manner which is well documented in the literature, as described above under method 1).

The weight-% can be converted to mol-% by calculation. It is well documented in the literature.

Below is exemplified how polar comonomer content obtained from the above method (1) or (2), depending on the amount thereof, can be converted to micromol or mmol per g polar comonomer as used in the definitions in the text and claims:

The millimoles (mmol) and the micro mole calculations have been done as described below.

For example, if 1 g of the poly(ethylene-co-butylacrylate) polymer, which contains 20 wt % butylacrylate, then this material contains 0.20/M$_{butylacrylate}$ (128 g/mol)=1.56×10$^{-3}$ mol. (=1563 micromoles).

The content of polar comonomer units in the polar copolymer $C_{polar\ comonomer}$ is expressed in mmol/g (copolymer). For example, a polar poly(ethylene-co-butylacrylate) polymer which contains 20 wt. % butyl acrylate comonomer units has a $C_{polar\ comonomer}$ of 1.56 mmol/g. The used molecular weights are: M$_{butylacrylate}$=128 g/mole, M$_{ethylacrylate}$=100 g/mole, M$_{methylacrylate}$=86 g/mole).

Density

Low density polyethylene (LDPE): The density was measured according to ISO 1183-2. The sample preparation was executed according to ISO 1872-2 Table 3 Q (compression moulding).

Low pressure process polyethylene: Density of the polymer was measured according to ISO 1183/1872-2B.

Xylene Solubles (XS)

Xylene solubles were determined at 23° C. according ISO 6427.

Method for Determination of the Amount of Double Bonds in the Polymer Composition or in the Polymer A) Quantification of the Amount of Carbon-Carbon Double Bonds by IR Spectroscopy Quantitative infrared (IR) spectroscopy was used to quantify the amount of carbon-carbon doubles (C=C). Calibration was achieved by prior determination of the molar extinction coefficient of the C=C functional groups in representative low molecular weight model compounds of known structure.

The amount of each of these groups (N) was determined as number of carbon-carbon double bonds per thousand total carbon atoms (C=C/1000C) via:

$$N=(A\times 14)/(E\times L\times D)$$

were A is the maximum absorbance defined as peak height, E the molar extinction coefficient of the group in question (l·mol$^{-1}$·mm$^{-1}$), L the film thickness (mm) and D the density of the material (g·cm$^{-1}$).

The total amount of C=C bonds per thousand total carbon atoms can be calculated through summation of N for the individual C=C containing components.

For polyethylene samples solid-state infrared spectra were recorded using a FTIR spectrometer (Perkin Elmer 2000) on compression moulded thin (0.5-1.0 mm) films at a resolution of 4 cm$^{-1}$ and analysed in absorption mode.

1) Polymer Compositions Comprising Polyethylene Homopolymers and Copolymers, Except Polyethylene Copolymers with >0.4 wt % Polar Comonomer For polyethylenes three types of C=C containing functional groups were quantified, each with a characteristic absorption and each calibrated to a different model compound resulting in individual extinction coefficients:
    vinyl (R—CH=CH2) via 910 cm$^{-1}$ based on 1-decene [dec-1-ene] giving E=13.13 l·mol$^{-1}$·mm$^{-1}$
    vinylidene (RR'C=CH2) via 888 cm$^{-1}$ based on 2-methyl-1-heptene [2-methylhept-1-ene] giving E=18.24 l·mol$^{-1}$–mm$^{-1}$
    trans-vinylene (R—CH=CH—R') via 965 cm$^{-1}$ based on trans-4-decene [(E)-dec-4-ene] giving E=15.14 l·mol$^{-1}$·mm$^{-1}$ For polyethylene homopolymers or copolymers with <0.4 wt % of polar comonomer linear baseline correction was applied between approximately 980 and 840 cm$^{-1}$.

2) Polymer Compositions Comprising Polyethylene Copolymers with >0.4 wt % Polar Comonomer For polyethylene copolymers with >0.4 wt % of polar comonomer two types of C=C containing functional groups were quantified, each with a characteristic absorption and each calibrated to a different model compound resulting in individual extinction coefficients:

vinyl (R—CH=CH2) via 910 cm$^{-1}$ based on 1-decene [dec-1-ene] giving E=13.13 l·mol$^{-1}$·mm$^{-1}$ vinylidene (RR'C=CH2) via 888 cm$^{-1}$ based on 2-methyl-1-heptene [2-methyl-hept-1-ene] giving E=18.24 l·mol$^{-1}$·mm$^{-1}$

EBA:

For poly(ethylene-co-butylacrylate) (EBA) systems linear baseline correction was applied between approximately 920 and 870 cm$^{-1}$.

EMA:

For poly(ethylene-co-methylacrylate) (EMA) systems linear baseline correction was applied between approximately 930 and 870 cm$^{-1}$.

3) Polymer Compositions Comprising Unsaturated Low Molecular Weight Molecules

For systems containing low molecular weight C=C containing species direct calibration using the molar extinction coefficient of the C=C absorption in the low molecular weight species itself was undertaken.

B) Quantification of Molar Extinction Coefficients by IR Spectroscopy

The molar extinction coefficients were determined according to the procedure given in ASTM D3124-98 and ASTM D6248-98. Solution-state infrared spectra were recorded using a FTIR spectrometer (Perkin Elmer 2000) equipped with a 0.1 mm path length liquid cell at a resolution of 4 cm$^{-1}$.

The molar extinction coefficient (E) was determined as l·mol$^{-1}$·mm$^{-1}$ via:

$$E = A/(C \times L)$$

where A is the maximum absorbance defined as peak height, C the concentration (mol·l$^{-1}$) and L the cell thickness (mm).

At least three 0.18 mol·l$^{-1}$ solutions in carbondisulphide (CS$_2$) were used and the mean value of the molar extinction coefficient determined.

DSC Method: the Lamella Thickness and the Crystallinity Determinations.

The lamella thickness distribution is analysed according to the description below.

The melting curves and temperatures from a DSC (Differential Scanning Caliometry) analysis of 5 mg of sample obtained are used for calculating the lamella thickness distribution. The DSC analysis cycle is as follows: a first heating from 30° C. to 130° C. at a rate of 10° C./min, then the sample is kept for 2 minutes at 130° C., before cooling from 130° C. to −30° C. at a rate of 10° C./min and then the sample is kept at −30° C. for 2 min before the second heating from −30° C. to 220° C. at a rate of 10° C./min is done.

The lamella thickness for each melting temperature is calculated according to the Thompson-Gibbs equation:

$$T_m = T°_m(1 - 2\sigma_e/\Delta H°_m L_c)$$

Where T°$_m$ is equilibrium melting point for an infinite crystal, σ$_e$ is the specific surface free energy of the basal plane, and ΔH°$_m$ is the enthalpy of melting per mass unit and they are all constants, L$_c$ is the lamella thickness and T$_m$ is the melting temperature of the lamella.

Parameters for lamella thickness calculations of Polyethylene

| | |
|---|---|
| T°$_m$ [m/K] | 415 |
| σ$_e$ [J/m$^2$] | 93 × 10$^{-3}$ |
| ΔH°$_m$ [J/m$^3$] | 300 × 10$^6$ |

Reference J. A. Parker, D. C. Bassett, R. H. Olley, P. Jaaskelainen; On high pressure crystallization and the characterization of linear low-density polyethylenes; Polymer 1994, 35 (19), 4140-4145.

Using the values above, the equation for determining lamella thickness for PE using the Thompson-Gibbs equation will be:

$$L_c = 0.62 \times 10^{-9} \times 415/(415 - T_m)$$

The melting temperature is given in Kelvin and the unit for lamella thickness is m.

The lamella thickness distribution is calculated using the second heating cycle in the DSC analysis to ensure that the thermal history of the sample is taken away. The lamella thickness distribution is calculated in intervals of 1° C. from −20° C. to 220° C. For each temperature interval, which relates to certain lamella thickness interval according to the Thompson-Gibbs equation, the corresponding specific heat input ΔH$_i$ is calculated from the DSC analysis. The weight fraction of crystals melting in a certain lamella thickness intervall is calculated by dividing the ΔH$_i$ with the total specific heat input for the melting of all crystals ΔH$_{total}$.

From ΔH$_{total}$, the crystallinity of the material can be determined: crystallinity [%]=100×ΔH$_{total}$/ΔH$_{100}$% where ΔH$_{100\%}$ (J/g) is 290.0 for PE (L. Mandelkern, Macromolecular Physics, Vol. 1-3, Academic Press, New York 1973, 1976 &1980).

The result from this type of analysis is usually presented as a plot displaying the crystal fraction as a function of lamella thickness. This data can easily be used to determine the "crystal fraction with lamella thickness >10 nm". Multiplying this fraction with the overall crystallinity of the material results in the overall "weight fraction crystals with lamella thickness >10 nm".

The used properties determined with the DSC method:

In this context the above used definitions have the following meanings:

"Lamella thickness"=Thickness of crystal lamellas in the material (fractions*<0.1 wt % are ignored).

*Refer to crystal fractions of one degree Celsius intervals.

"Crystal fraction with lamella thickness >10 nm"=Fraction of the crystals which have a thickness above 10 nm based on the amount of the crystallised part of the polymer "Crystallinity"=wt % of the polymer that is crystalline "Weight fraction of crystals with lamella thickness >10 nm [wt %]"="Crystal fraction with lamella thickness >10 nm"×"Crystallinity".

DC Conductivity Method (1)

The plaques are compression moulded from pellets of the test polymer composition. The final plaques consist of the test polymer composition and have a thickness of 1 mm and a diameter of 330 mm.

The conductivity measurement can be performed using a test polymer composition which does not comprise or comprises the optional crosslinking agent. In case of no crosslinking agent the conductivity is measured from a non-crosslinked plaque sample using the below procedure. If the test polymer composition comprises the crosslinking agent, then the crosslinking occurs during the preparation of the plaque samples, whereby the conductivity is then measured according to the below procedure from the resulting crosslinked plaque sample. Crosslinking agent, if present in the polymer composition prior to crosslinking, is preferably a peroxide, as herein.

The plaques are press-moulded at 130° C. for 12 min while the pressure is gradually increased from 2 to 20 MPa.

Thereafter the temperature is increased and reaches 180° C. after 5 min. The temperature is then kept constant at 180° C. for 15 min during which the plaque becomes fully crosslinked by means of the peroxide, if present in the test polymer composition. Finally the temperature is decreased using the cooling rate 15° C./min until room temperature is reached when the pressure is released. The plaques are immediately after the pressure release wrapped in metallic foil in order to prevent loss of volatile substances.

A high voltage source is connected to the upper electrode, to apply voltage over the test sample. The resulting current through the sample is measured with an electrometer. The measurement cell is a three electrodes system with brass electrodes. The brass electrodes are equipped with heating pipes connected to a heating circulator, to facilitate measurements at elevated temperature and provide uniform temperature of the test sample. The diameter of the measurement electrode is 100 mm. Silicone rubber skirts are placed between the brass electrode edges and the test sample, to avoid flashovers from the round edges of the electrodes.

The applied voltage was 30 kV DC meaning a mean electric field of 30 kV/mm. The temperature was 70° C. The current through the plaque was logged throughout the whole experiments lasting for 24 hours. The current after 24 hours was used to calculate the conductivity of the insulation.

This method and a schematic picture of the measurement setup for the conductivity measurements has been thoroughly described in a publication presented at the Nordic Insulation Symposium 2009 (Nord-IS 09), Gothenburg, Sweden, Jun. 15-17, 2009, page 55-58: Olsson et al, "Experimental determination of DC conductivity for XLPE insulation".

DC Conductivity Method (2)

Electrical conductivity of a 5.5 mm model cable sample of the crosslinked test polymer composition as an insulation layer and the crosslinked test semiconductive composition as an inner and outer semiconductive layer and measured at 70° C. and 27 kV/mm mean electric field Model Cable Preparation:

A three layered cable core was produced using a 1+2 construction on a pilot scale CCV line. The conductor was made of Aluminium and had an area of 50 mm$^2$.

The inner and outer semiconductive layers consisted of the same semiconductive composition: LE0550, commercial grade from Borealis with acetylene carbon black, density 1100 kg/cm$^3$, DC volume resistivity at 23° C. less than 100 Ωcm and at 90° C. less than 1000 Ωcm (ISO3915), Hot Set Test (200° C., 0.20 MPa, IEC 60811-2-1): Elongation under load 25%, Permanent deformation 0%. Göttfert Elastograph 1.2 Nm.

The inner semiconductive layer was 1.0 mm thick, the insulation layer 5.5 mm thick and the outer semiconductive layer 0.8 mm thick. The line speed used for the manufacturing of the cable cores was 2 m/min. This CCV line has two heating zones for dry-curing (crosslinking under nitrogen), each of 3 m, and the temperatures used on these two zones were 450 and 400° C. respectively. The cooling section was 12.8 m long and the cable was cooled with water holding a temperature of around 25-30° C. Immediately after the production the cable core was tightly wrapped with an Aluminium foil (0.15 mm thick) to keep the peroxide by-products within the cable core.

The cable was subjected to two thermal treatments prior to measurement:
1) A first thermal treatment, where the Aluminium foil was temporarily removed and the cable degassed in oven at 70° C. for 18 hours.
2) A second thermal treatment, where the cable core was tightly wrapped with the Aluminium foil. This was done in oven at 70° C. for 120 hours.

Conduction Current Measurement:

The measurements were then carried out in an oven at 70° C. by the use of a three-terminal cell where 150 kV DC voltage was applied on the conductor and the tightly wrapped Aluminium foil was connected to the low voltage electrode. This corresponds to 27 kV/mm mean electric field (the ratio between applied voltage and insulation thickness). The test circuit consisted of a high voltage generator, an air insulated voltage divider, the test cable and its terminations, and a current meter and its amplifier. Also protection devices are included for the case of failures in the test circuit. The current meter is connected to the outer screen of the cable at each cable end and to ground. Guard electrodes were used in order to avoid leakage currents over the terminations from disturbing the measurements. The distance between the cable electrodes (the measurement zone) was 50 m and this cable section was placed inside the oven whereas the cable ends were located outside the oven.

The electric conductivity is calculated from the conduction current (leakage current) after 24 hours voltage application by using equations 1 and 2

The conductivity σ (S/m) has been calculated using the formula $$\sigma = \frac{\ln\left(\frac{D}{d}\right)}{2\pi L R} \quad \text{Equation 1}$$

$$R = U/I = \text{Applied voltage (V)/leakage current (A)} \quad \text{Equation 2}$$

L: Length of measurement zone (50 m)
U: Applied voltage (150 kV)
D and d: The outer and inner diameter of the insulation

EXPERIMENTAL PART

Preparation of the Components of the Polymer Compositions of the Present Invention and of the References The polyolefins were low density polyethylenes produced in a high pressure reactor. The production of inventive and reference polymers is described below. As to CTA feeds, e.g. the PA content can be given as liter/hour or kg/h and converted to either units using a density of PA of 0.807 kg/liter for the recalculation.

LDPE1:

Ethylene with recycled CTA was compressed in a 5-stage precompressor and a 2-stage hyper compressor with intermediate cooling to reach initial reaction pressure of ca 2628 bar. The total compressor throughput was ca 30 tons/hour. In the compressor area approximately 4.9 liters/hour of propion aldehyde (PA, CAS number: 123-38-6) was added together with approximately 81 kg propylene/hour as chain transfer agents to maintain an MFR of 1.89 g/10 min. Here also 1,7-octadiene was added to the reactor in amount of 27 kg/h. The compressed mixture was heated to 157° C. in a preheating section of a front feed two-zone tubular reactor. A mixture of commercially available peroxide radical initiators dissolved in isododecane was injected just after the preheater in an amount sufficient for the exothermal polymerisation reaction to reach peak temperatures of ca 275° C. after which it was cooled to approximately 200° C. The subsequent 2nd peak reaction temperatures was 264° C. The reaction mixture was depressurised by a kick valve, cooled and polymer was separated from unreacted gas.

LDPE2:

Purified ethylene was liquefied by compression and cooling to a pressure of 90 bars and a temperature of −30° C. and split up into to two equal streams of roughly 14 tons/hour each. The CTA (methyl ethyl ketone (MEK)), air and a commercial peroxide radical initiator dissolved in a solvent were added to the two liquid ethylene streams in individual amounts. Here also 1,7-octadiene was added to the reactor in amount of 40 kg/h. The two mixtures were separately pumped through an array of 4 intensifiers to reach pressures of 2200-2300 bars and exit temperatures of around 40° C. These two streams were respectively fed to the front (zone 1) (50%) and side (zone 2) (50%) of a split-feed two-zone tubular reactor. MEK was added in amounts of 190 kg/h to the front stream to maintain a $MFR_2$ of around 2 g/10 min. The front feed stream was passed through a heating section to reach a temperature sufficient for the exothermal polymerization reaction to start. The reaction reached peak temperatures were 251° C. and 290° C. in the first and second zones, respectively. The side feed stream cooled the reaction to an initiation temperature of the second zone of 162° C. Air and peroxide solution was added to the two streams in enough amounts to reach the target peak temperatures. The reaction mixture was depressurized by product valve, cooled and polymer was separated from unreacted gas.

TABLE 1

Polymer properties of LDPE1 and LDPE2

| Base Resin Properties | LDPE1 | LDPE2 |
|---|---|---|
| MFR 2.16 kg, at 190° C. [g/10 min] | 1.89 | 1.90 |
| Density [kg/m³] | 923 | 922 |
| Vinyl [C = C/1000 C] | 0.54 | 0.33 |
| Vinylidene [C = C/1000 C] | 0.16 | 0.27 |
| Trans-vinylene [C = C/1000 C] | 0.06 | 0.07 |

HDPE:

A conventional unimodal high density polyethylene (0.8 mol % 1-butene content, as the comonomer) which is produced in a gas phase reactor. The HDPE has an $MFR_2$ of 12 g/10 min (190° C./2.16 kg) and a density of 962 kg/m³. The same base resin, except that combined with another additive system than specified in table 2, is used in a commercially available grade Bormed HE9621-PH (supplier Borealis).

Compounding of the Polymer Compositions:

Each polymer component of a test polymer composition were added as separate pellets to a pilot scale extruder (Prism TSE 24TC) together with additives, if not present in the pellets, other than the crosslinking agent. The obtained mixture was meltmixed in conditions given in the below table and extruded to pellets in a conventional manner.

| Set Values Temperatures [° C.] | | | | | | | Extruder | | |
|---|---|---|---|---|---|---|---|---|---|
| | | | | | | | Output | Pressure | Filter |
| Zone 1 | Zone 2 | Zone 3 | Zone 4 | Zone 5 | Zone 6 | rpm | [kg/h] | [bar] | [mesh] |
| 80 | 155 | 165 | 175 | 175 | 180 | 225 | 7.5 | 60 | 325 |

The crosslinking agent, herein peroxide, if present, was added on to the pellets and the resulting pellets were used for the experimental part.

The amounts of polymer component(s), peroxide, additives (AO and SR) are given in table 2.

TABLE 2

Polymer compositions of the invention and reference compositions and the electrical conductivity results:

| | Inv. comp1 | Inv. comp2 | Inv. comp3 | Inv. comp4 | Inv. comp5 | Ref 1 | Ref 2 |
|---|---|---|---|---|---|---|---|
| Components | | | | | | | |
| LDPE1, wt %* | 95 | 90 | 85 | 80 | | 100 | |
| LDPE2, wt %* | | | | | 80 | | 100 |
| HDPE, wt %* | 5 | 10 | 15 | 20 | 20 | | |
| AO, wt %** | 0.08 | 0.08 | 0.08 | 0.08 | 0.08 | 0.08 | 0.08 |
| SR, wt %** | 0.05 | 0.05 | 0.05 | 0.05 | 0.35 | 0.05 | 0.35 |
| Crosslinking agent, mmol—O—O—/kg polymer composition (wt %**) | 28 (0.75) | 28 (0.75) | 28 (0.75) | 28 (0.75) | 50 (1.35) | 28 (0.75) | 50 (1.35) |
| Lamella thickness [nm] | 1.9-14 | 1.9-15 | 1.9-16 | 1.9-16 | 1.9-16 | 1.9-8.5 | 1.8-8.6 |
| Crystal fraction with lamella thickness >10 nm [wt %] | 5.3 | 9.9 | 17.3 | 20.1 | 18 | 0 | 0 |
| Crystallinity [wt %] | 44.2 | 46.1 | 47.6 | 47.6 | 47.5 | 45.3 | 40 |
| Weight fraction of crystals with lamella thickness >10 nm [wt %] | 2.3 | 4.6 | 8.2 | 9.6 | 8.5 | 0 | 0 |
| Electrical properties | | | | | | | |

TABLE 2-continued

Polymer compositions of the invention and reference compositions and the electrical conductivity results:

|  | Inv. comp1 | Inv. comp2 | Inv. comp3 | Inv. comp4 | Inv. comp5 | Ref 1 | Ref 2 |
|---|---|---|---|---|---|---|---|
| DC conductivity | | | | | | | |
| Method (1), 1 mm plaque (fS/m) | 7.5 | 3.9 | 3.9 | 5.6 | 47 | 26 | 122 |
| Method (2), 5.5 mm cable (fS/m) | | | | 15.3 | | 41.6 | |

Crosslinking agent: Dicumylperoxide (CAS no. 80-43-3)
AO: Antioxidant: 4,4'-thiobis (2-tertbutyl-5-methylphenol) (CAS no. 96-69-5)
SR: Scorch retardant: 2,4-Diphenyl-4-methyl-1-pentene (CAS 6362-80-7)
*The amounts of polymer components in table are based on the combined amount of the used polymer components. The amount 100 wt % of polymer component in table 1 means that the polymer is the sole polymer component.
**The amounts of peroxide (wt %), AO and SR are based on the final composition.
In this context the above used definitions have the following meanings:
"Lamella thickness" = Thickness of crystal lamellas in the material (fractions* <0.1 wt % are ignored).
*Refer to crystal fractions of one degree Celsius intervals.
"Crystal fraction with lamella thickness >10 nm" = Fraction of the crystals which have a thickness above 10 nm based on the amount of the crystallised part of the polymer
"Crystallinity" = wt % of the polymer that is crystalline
"Weight fraction of crystals with lamella thickness >10 nm [wt %] "= Crystal fraction with lamella thickness >10 nm" × "Crystallinity".

The invention claimed is:

1. A process for producing a power cable wherein the process comprises the steps of applying on a conductor an inner semiconductive layer comprising a first semiconductive composition, an insulation layer comprising an insulation composition and an outer semiconductive layer comprising a second semiconductive composition, in that order, wherein the composition of at least the insulating layer comprises a polymer composition comprising
   (a) from 1.0 to 40 wt % of a polyethylene selected from the group consisting of: very low density polyethylene (VLDPE) having a density of from 850 to 909 kg/m³, linear low density polyethylene (LLDPE) having a density of from 909 to 930 kg/m³, medium density polyethylene (MDPE) having a density of from 930 to 945 kg/m³, and high density polyethylene (HDPE) having a density of 945 kg/m³ or more;
   (b) from 60 to 99 wt % of a low density polyethylene (LDPE), and
   (c) dicumyl peroxide in an amount of 0.1 to 110 mmol —O—O—/kg polymer composition.

2. The process according to claim 1, wherein the process comprises a further step of crosslinking at least the insulation composition of said insulation layer.

3. The process according to claim 2, the process further comprising crosslinking at least one of the first semiconductive composition of the inner semiconductive layer and the second semiconductive composition of the outer semiconductive layer, in the presence of a crosslinking agent at crosslinking conditions.

4. A polymer composition comprising
   (a) from 0.1 to 40 wt % of a polyethylene selected from the group consisting of: very low density polyethylene (VLDPE) having a density of from 850 to 909 kg/m³, linear low density polyethylene (LLDPE) having a density of from 909 to 930 kg/m³, medium density polyethylene (MDPE) having a density of from 930 to 945 kg/m³, and high density polyethylene (HDPE) having a density of 945 kg/m³ or more;
   (b) from 60 to 99.9 wt % of a low density polyethylene (LDPE); and
   (c) dicumyl peroxide in an amount of 0.1 to 110 mmol —O—O—/kg polymer composition.

5. The polymer composition according to claim 4, wherein the polymer composition has an electrical conductivity of 160 fS/m or less, when measured according to DC conductivity method (1) using a 1 mm thick plaque sample as described under "Determination Methods".

6. The polymer composition according to claim 4, wherein the amount of the polyethylene (a) is from 1.0 to 30 wt %, based on the combined weight of the polyethylene (a) and the LDPE (b).

7. The polymer composition according to claim 4, wherein the amount of the LDPE (b) is from 70 to 99 wt %, based on the combined weight of the polyethylene (a) and the LDPE (b).

8. The polymer composition according to claim 4, wherein the polyethylene (a) is an ethylene homopolymer or a copolymer of ethylene with one or more comonomer(s).

9. The polymer composition according to claim 4, wherein the LDPE (b) is an LDPE polymer selected from a saturated or an unsaturated LDPE homopolymer or a saturated or an unsaturated LDPE copolymer of ethylene with one or more comonomer(s).

10. The polymer composition according to claim 4, wherein the LDPE (b) is an unsaturated LDPE polymer, which is selected from an unsaturated LDPE homopolymer or an unsaturated LDPE copolymer of ethylene with one or more comonomer(s), and comprises a total amount of carbon-carbon double bonds/1000 carbon atoms of more than 0.4/1000 carbon atoms.

11. The polymer composition according to claim 4, wherein the LDPE (b) is an unsaturated LDPE copolymer of ethylene with at least one polyunsaturated comonomer.

* * * * *